United States Patent [19]

Manka

[11] Patent Number: 5,072,378
[45] Date of Patent: Dec. 10, 1991

[54] DIRECT ACCESS STORAGE DEVICE WITH INDEPENDENTLY STORED PARITY

[75] Inventor: Paul S. Manka, Boulder, Colo.

[73] Assignee: Storage Technology Corporation, Louisville, Colo.

[21] Appl. No.: 452,674

[22] Filed: Dec. 18, 1989

[51] Int. Cl.⁵ .......................... G06F 3/00; G06F 7/00; G06F 7/16
[52] U.S. Cl. ................................. 395/575; 371/40.1; 364/DIG. 1
[58] Field of Search ... 364/200 MS File, 900 MS File; 365/200, 230.03, 230.04; 360/22, 24, 27; 371/2.2, 39.1, 37.7, 38, 40.1, 40.4

[56] References Cited

U.S. PATENT DOCUMENTS

| | | | |
|---|---|---|---|
| 4,092,732 | 5/1978 | Ouchi | 364/200 |
| 4,434,487 | 2/1984 | Rubinson et al. | 364/200 |
| 4,506,364 | 3/1985 | Aichelmann, Jr. et al. | 371/2.2 |
| 4,622,598 | 11/1986 | Doi et al. | 360/22 |
| 4,722,085 | 1/1988 | Flora et al. | 371/38 |
| 4,761,785 | 8/1988 | Clark et al. | 371/2.2 |
| 4,775,978 | 10/1988 | Hartmers | 371/40.1 |
| 4,817,035 | 3/1989 | Timsit | 360/22 X |
| 4,837,680 | 6/1989 | Crockett et al. | 364/200 |
| 4,914,656 | 4/1990 | Dunphy, Jr. et al. | 371/40.4 X |

OTHER PUBLICATIONS

Storage Tek Product Description Manual ED 058-7, Dec. 1988.
Storage Tek Product Description Manual 0500-B, Nov. 1989.
A Case for Redundant Arrays of Inexpensive Disks (RAID), David A. Patterson et al., ACM SIGMOD Conference, Chicago, Ill., Jun. 1-3, 1988.
Introduction to Redundant Arrays of Inexpensive Disks (RAID), David A. Patterson et al., CH2686-4/89/0000/0112501.00 1989 IEEE., Apr./1989.

Primary Examiner—Alyssa H. Bowler
Attorney, Agent, or Firm—Dorr, Carson, Sloan & Peterson

[57] ABSTRACT

A failure independent, fault tolerant Direct Access Storage Device (DASD) storage subsystem comprising a Disk Control Unit and a number of Physical Devices is provided with a parity Generator for generating a parity for system records as the system records are transferred between the storage subsystem and a CPU of a data processing system. The parity is stored on a different unit so that if one unit containing portions of a system record becomes unavailable, the unavailable portion of the record is reconstructed during transfer to the CPU from the remainder of the record and the parity. The storage system of the invention can accommodate variable length data records without requiring operating system modifications.

70 Claims, 10 Drawing Sheets

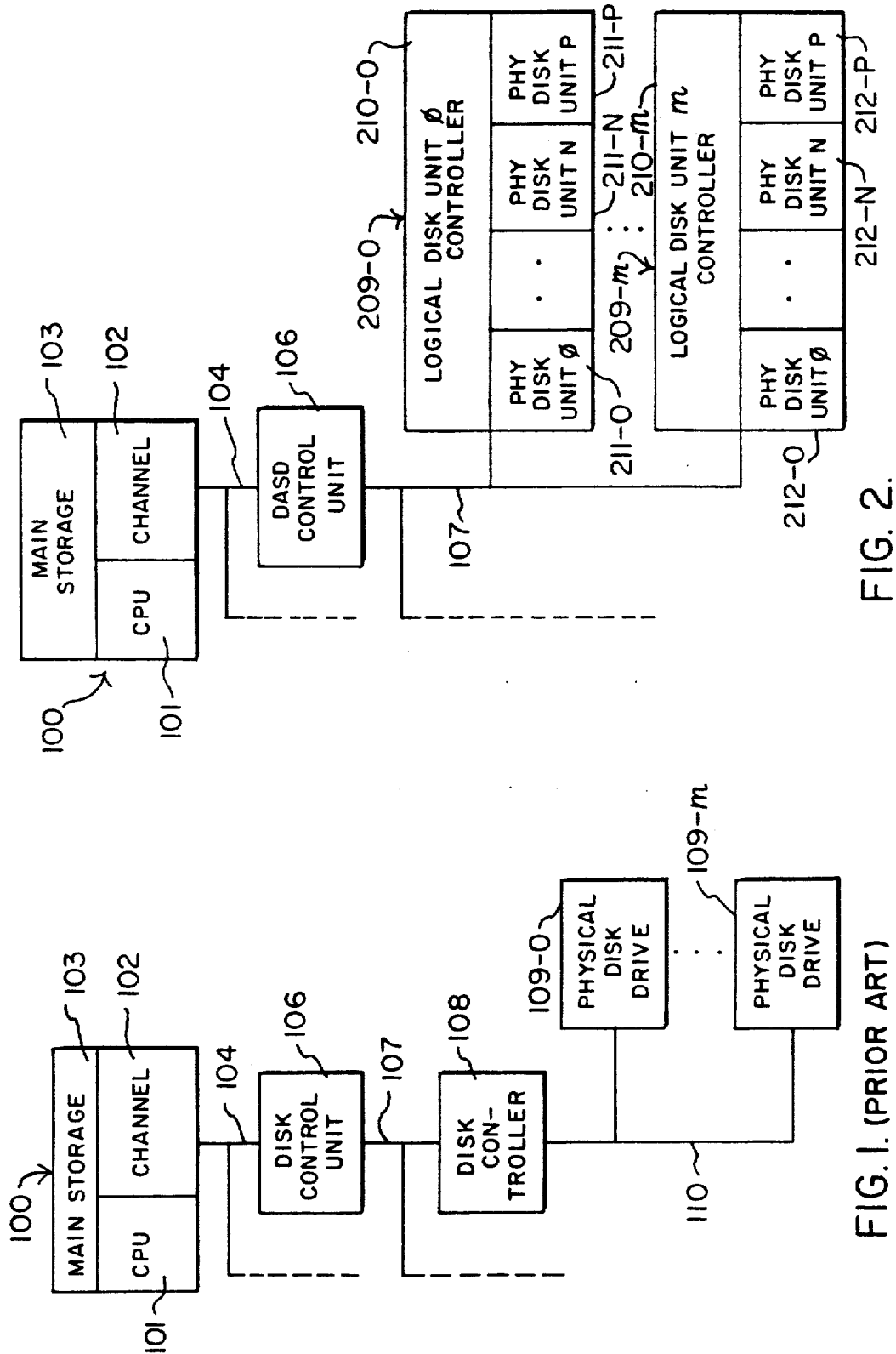

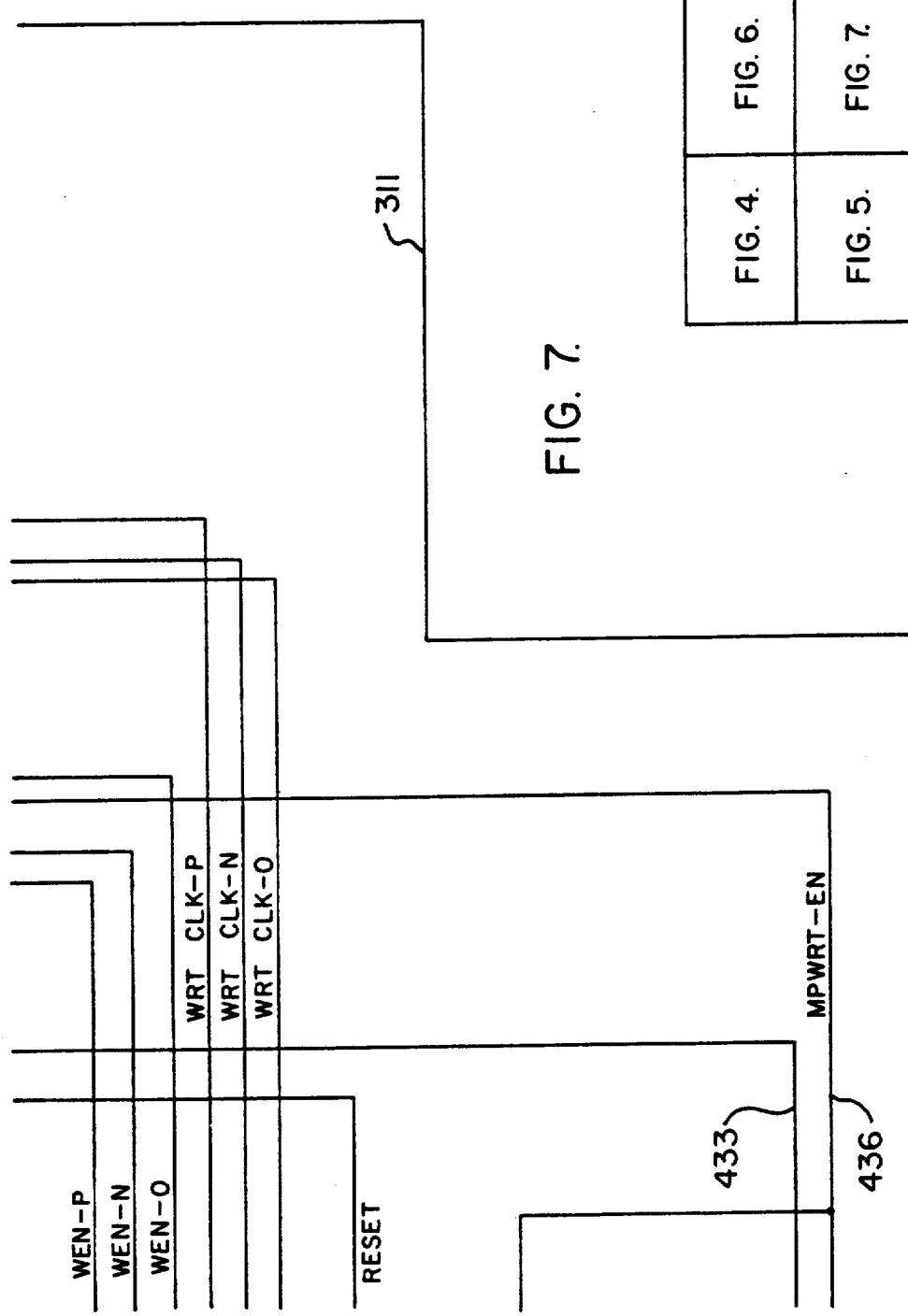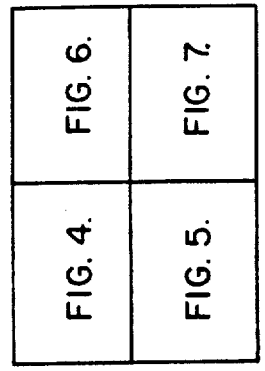

| | | | | |
|---|---|---|---|---|
| G1-0-0 / G1-1-0 | HA-0-0 / HA-1-0 | R0-C-0-0 | R0-C-1-0 | R0-D-0-0 |
| 00-0-0 | 00-0-1 | 00-0-2 | 00-0-3 | 00-0-4 |
| R0-D-1-0 | R1-C-0-0 | R1-C-1-0 | R1-D-0-0 | R1-D-1-0 |
| 00-0-5 | 00-0-6 | 00-0-7 | 00-0-8 | 00-0-9 |
| R2-C-0-0 | R2-C-1-0 | R2-K-0-0 | R2-K-1-0 | R2-D-0-0 |
| 00-0-A | 00-0-B | 00-0-C | 00-0-D | 00-0-E |
| R2-D-1-0 | R3-C-0-0 | R3-C-1-0 | R3-D-0-0 | R3-D-1-0 |
| 00-0-F | 00-0-10 | 00-0-11 | 00-0-12 | 00-0-13 |

```
00-0-0    — LOGICAL CYLINDER 00, HEAD 0, SECTOR 0.
00-0-13   —      "          "   00,   "  0,   "    13.

G1-0-0    — GAP 1 FOR VIRTUAL CYLINDER 0, HEAD 0.
G1-1-0    —  "  1  "     "        "    1,  "  0.

HA-0-0    — HA FOR VIRTUAL CYLINDER 0, HEAD 0.
HA-1-0    —  "  "     "       "    1,  "  0.

R0-C-0-0  — R0 COUNT FOR VIRTUAL CYLINDER 0, HEAD 0.
R0-C-1-0    "   "    "      "       "    1, HEAD 0.

R0-D-0-0  — R0 DATA FOR VIRTUAL CYLINDER 0, HEAD 0.
R0-D-1-0  —  "   "   "     "        "    1,  "  0.

R1-C-0-0  — R1 COUNT FOR VIRTUAL CYLINDER 0, HEAD 0.
R1-C-1-0    "   "    "      "       "    1,  "  0.

R1-K-0-0  — R1 KEY FOR VIRTUAL CYLINDER 0, HEAD 0.
R1-K-1-0    "   "   "     "        "    1,  "  0.

R1-D-0-0  — R1 DATA FOR VIRTUAL CYLINDER 0, HEAD 0.
R1-D-1-0  —  "   "   "     "        "    1,  "  0.
```

FIG. 11.

DIRECT ACCESS STORAGE DEVICE WITH INDEPENDENTLY STORED PARITY

FIELD OF THE INVENTION

This invention relates to data storage systems and in particular to an improved arrangement for recovering data stored in a memory unit which has failed. This invention further relates to a data storage system which uses a plurality of low capacity, low cost industry standard drives to emulate a high storage capacity, high cost vendor unique drive.

BACKGROUND OF THE INVENTION

The typical data processing and storage system generally comprises one or more peripheral memory units, such as disk devices, which are connected to a central processor unit (CPU) through a disk control unit and a channel. The function of the memory units is to store data the CPU uses in performing its data processing tasks.

Various types of memory units are used in data processing systems. The response time and capacities of the memory devices used vary significantly, and in order to maximize system throughput while controlling costs, the choice of the particular type of memory unit to be used involves matching its response time to that of the CPU and its capacity to the storage needs of the data processing system. To minimize the impact on system throughput which may be caused by slow access devices, many data processing systems employ different types of memory units. Since the access time and capacity affects the cost of storage, a typical system may include a fast access small capacity directly accessible monolithic memory for data that is used frequently and a string of disk drives which are connected to the system through control units for data which is less frequently used. The storage capacities of these latter devices are generally several orders of magnitude greater than the monolithic memories and the storage cost/byte of data is less.

A problem exists if one of the large capacity memory units fails so that the information contained on that unit is no longer available to the system. Generally, such a failure will shut down the entire system. The prior art has suggested several ways of solving the problem. "IBM 3990 Storage Control Introduction," IBM publication GA 32-0098, in the chapter describing dual copy shows the provision of a duplicate set of memory units to store a duplicate file of all data. This is also shown in U. S. Pat. 4,837,680 of 1/6/89 to Crockett et al. While such a solution solves the problem, it increases the cost of storage and adversely impacts system performance since any change to stored data requires writing two records. It also adds the requirement of keeping track of where the duplicate records are stored in the event that the primary records are not available.

In systems in which the records are relatively small, it is possible to use error correcting codes which generate ECC (error correcting code) syndrome bits that are appended to the record. With ECC syndrome bits it is possible to correct small amounts of data that may be read erroneously. But this is generally not suitable for correcting or recreating long records which are in error or unavailable.

The prior art suggests other alternatives for solving the problem of a failure of one or more memory units. However, the suggested alternatives are suitable only for use in systems in which the data records are of fixed length. U.S. Pat. No. 4,092,732 of May 30, 1978 to Ouchi teaches the subdivision of records into a plurality of fixed length record segments which are stored together with a generated parity segment on a plurality of disk units. The Ouchi arrangement imposes a performance penalty in that his system does not match the physical characteristics of the emulated virtual device, such as the ability to slot sort (head switch within a cylinder) and the ability to switch between the individual heads of the same cylinder of a disk in one I/O operation. The Ouchi system can cause delays due to missed revolutions of the drive and head reorientation. In addition, large buffers and significant table overhead in the controlling mainframe is required to record and track where the virtual record segments are stored in the logical system. A data integrity exposure also exists in that if the tables are lost, destroyed, or a wrong version of a record or record segment is used by software, all of the data is lost.

The Ouchi system has a number of further disadvantages. It requires operating system modifications to accommodate variable length virtual records, such as those in the IBM CKD format. These modifications include extra commands and tables to map the virtual record data fields into the fixed length logical sectors shown by Ouchi. Ouchi also requires a special "clear buffer" command for his parity buffer 60. He also requires a special write command for each record segment. Ouchi also requires a special command to write the parity segment from his buffer 60. This requires an extra revolution of the Ouchi disk units to read successive records on the same virtual track since the time to write the parity byte of a first virtual record extends into the time available to read or write a second virtual record. For the same reason Ouchi cannot head switch between different tracks of the same virtual cylinder without missing revolutions while reading records in successive rotational positions. Because of these disadvantages, the Ouchi equipment does not emulate the physical characteristics of the virtual devices being emulated.

U.S. Pat. No. 4,775,978 of Oct. 4, 1988 to Hartness discloses the use of multiple memory devices plus a parity device to store records. However, Hartness has many of the disadvantages of Ouchi and doesn't support the physical characteristics of the emulated virtual device. Hartness requires operating system modifications and can only accommodate fixed length data fields. U.S. Pat. No. 4,817,035 of Mar. 28, 1989 to Timsit and U.S. Pat. No. 4,761,785 of Aug. 2, 1988 to Clark have similar disadvantages.

It can therefore be seen that it is a problem to provide a large capacity peripheral memory storage system for reliably storing records having variable length data fields in such a manner that a failure of one memory unit will not make the information stored on the unit unavailable to the CPU so as to cause a shutdown of the system or a substantial impairment in system operation. It is also a problem to provide a memory storage system that does not require operating system modifications, that can accommodate data fields of different lengths, and that can support the physical characteristics of the emulated virtual device.

SUMMARY OF THE INVENTION

The invention comprises a DASD (direct access storage device) system which functions as a logical DASD system by using a plurality of low capacity drives to emulate all aspects of a virtual vendor specific large capacity disk storage system. This provides a plug compatible peripheral data storage for a vendor specific mainframe computer. The system requires no operating system modifications to process virtual records having data fields of different lengths.

The above problems are solved by the storage system of the invention which has a plurality of n+1 data storage units, any one of which can fail, and an on the fly parity generator. The system includes control circuitry which allows a record to be transferred over a channel from the mainframe to the n storage units and concurrently to the parity generator. The control circuits cause the parity generator to generate parity over each n bytes of the record and to transfer the generated parity bytes to a separate parity storage unit on which none of the data bytes of the record are stored. The bytes of the data record and related parity bytes for the system records are therefore distributed across different storage units.

Any possible adverse impact on system performance is reduced substantially when the amount of data normally transferred between the mainframe and memory system is large. The system of the invention preserves the device performance characteristics of the vendor specific DASD units. As a record is being transferred to the n memory storage units, parity is generated on the fly during the memory write operation without additional time being required to write the parity byte on a parity separate unit. All physical characteristics of the emulated virtual device (the vendor specific DASD units) are preserved when accessing the logical device comprising the separate storage units of the invention. In addition to providing performance enhancements by supporting the physical characteristics of the virtual device, and by providing the ability to generate virtual device images that meet or exceed current channel transfer rates, the impact on the system throughput is minimized since parity is generated simultaneously with the transfer of the virtual record to or from the system mainframe and involves only the virtual record being transferred.

The invention is further advantageous in that it divides the surfaces of the logical disk units comprising the invention into a plurality of logical sectors and then stores virtual records from a plurality of virtual tracks in an interleaved manner on the logical sectors. This storage is done in such a manner than the bytes or segments of a single virtual record of a first virtual track are stored on alternate and nonadjacent logical sectors of a logical track. The sectors intermediate those which store bytes or segments for the first virtual record from a first virtual track are used to store the bytes from a different virtual record of a different virtual track. The storing of the bytes of a single virtual record on alternate, rather than consecutive and adjacent, logical sectors is advantageous in that the sectors not used to store the first virtual record are used, when the virtual record is read from the logical sectors, to simulate the byte times associated with the gaps that separate the fields of the virtual record on the virtual track. This is advantageous and provides for economy of space on the logical disk unit. If the bytes of a first virtual record were stored in consecutive and adjacent logical sectors, then portions of the logical sectors would have to be dedicated to provide the delay or gap times required that separate the fields of the virtual record. This necessity is eliminated in the present invention by using only alternate logical sectors to store the bytes of a single virtual record with the other sectors being used to both store a different virtual record and to simulate the byte times for the gaps between the fields of the first virtual record. Therefore, virtual records in consecutive rotational positions of a single cylinder can be read without missing revolutions.

The mechanism of combining individual physical disks units into a single logical image by interleaving two virtual track images onto a single logical track image makes it is possible to emulate physical devices that exceed the physical characteristics of physical devices available today and that are capable of driving today's and future channels at their maximum channel transfer rates, while at the same time supporting virtual track images with variable data field sizes.

DESCRIPTION OF THE DRAWINGS

The above and other advantages and features of the invention may be better understood from a reading of the following detailed description thereof taken in conjunction with the drawing in which:

FIG. 1 discloses a prior art mainframe and DASD system;

FIG. 2 discloses a DASD system embodying the invention;

FIGS. 4 through 7, when arranged as shown in FIG. 8 disclose further details of logical sector generator 303;

FIG. 11 discloses the interleaved virtual track format of the invention; and

DETAILED DESCRIPTION

Figure 3:
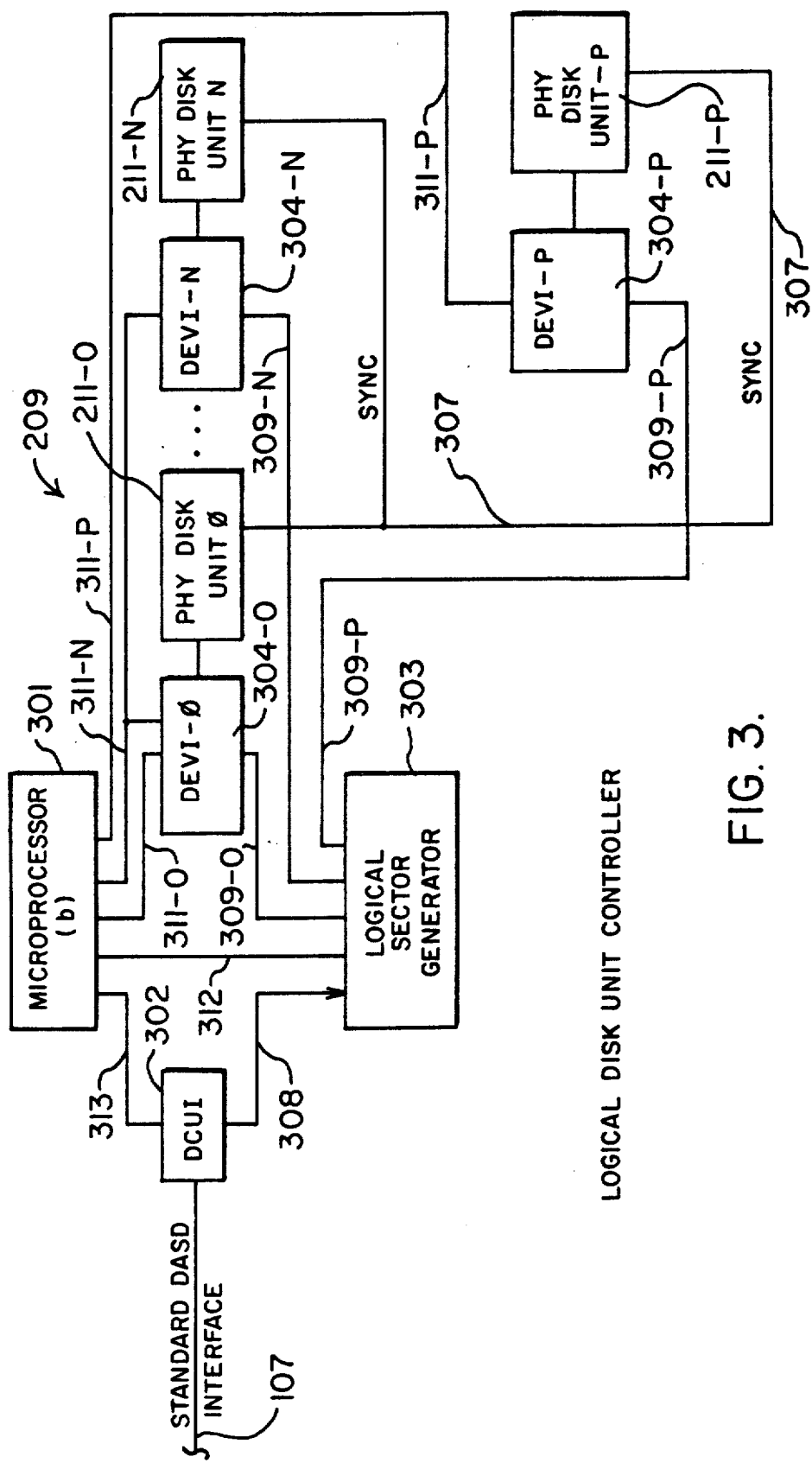
FIG. 3 discloses further details of logical disk unit controller 209.
Figure 4:
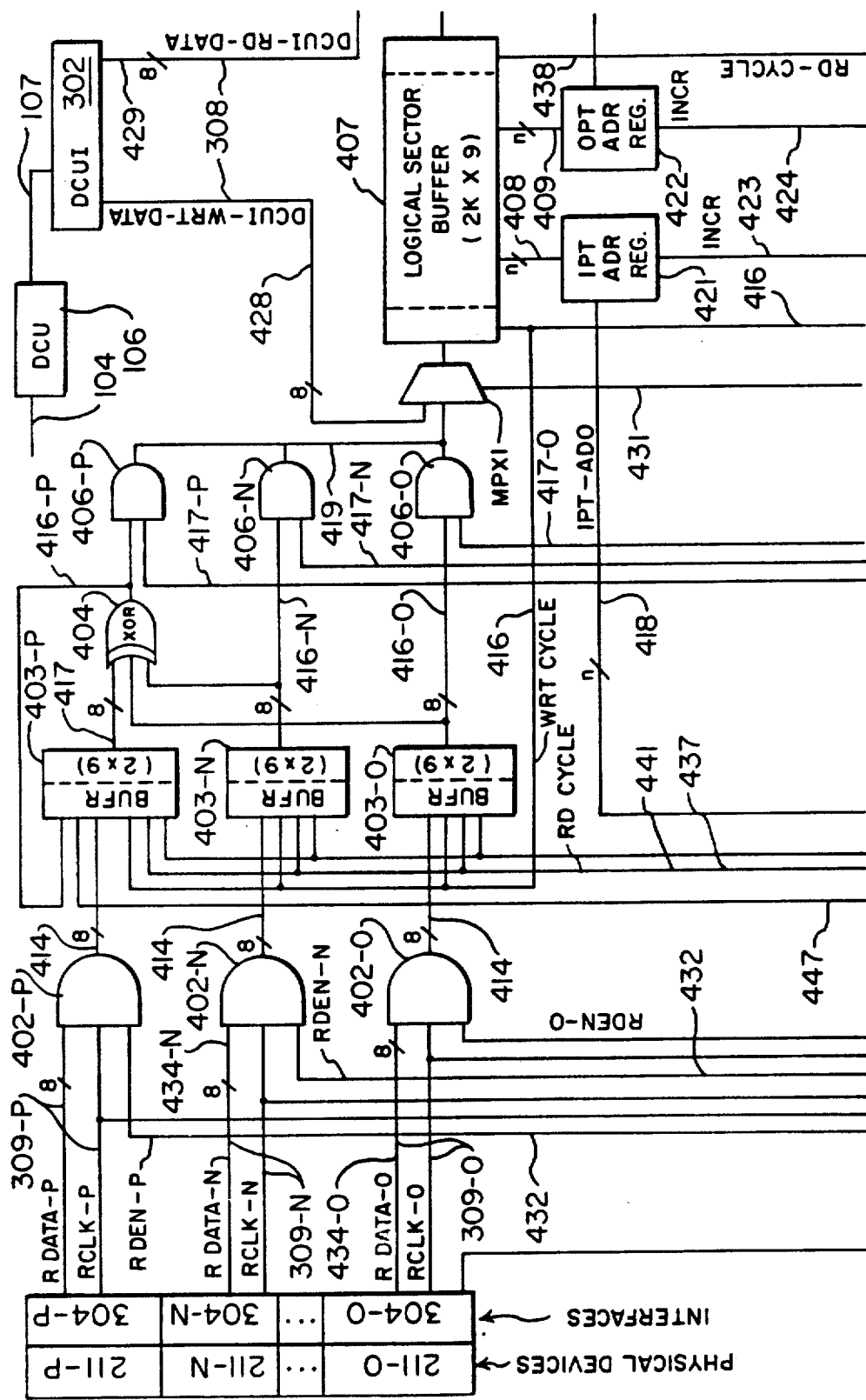
Figure 5:
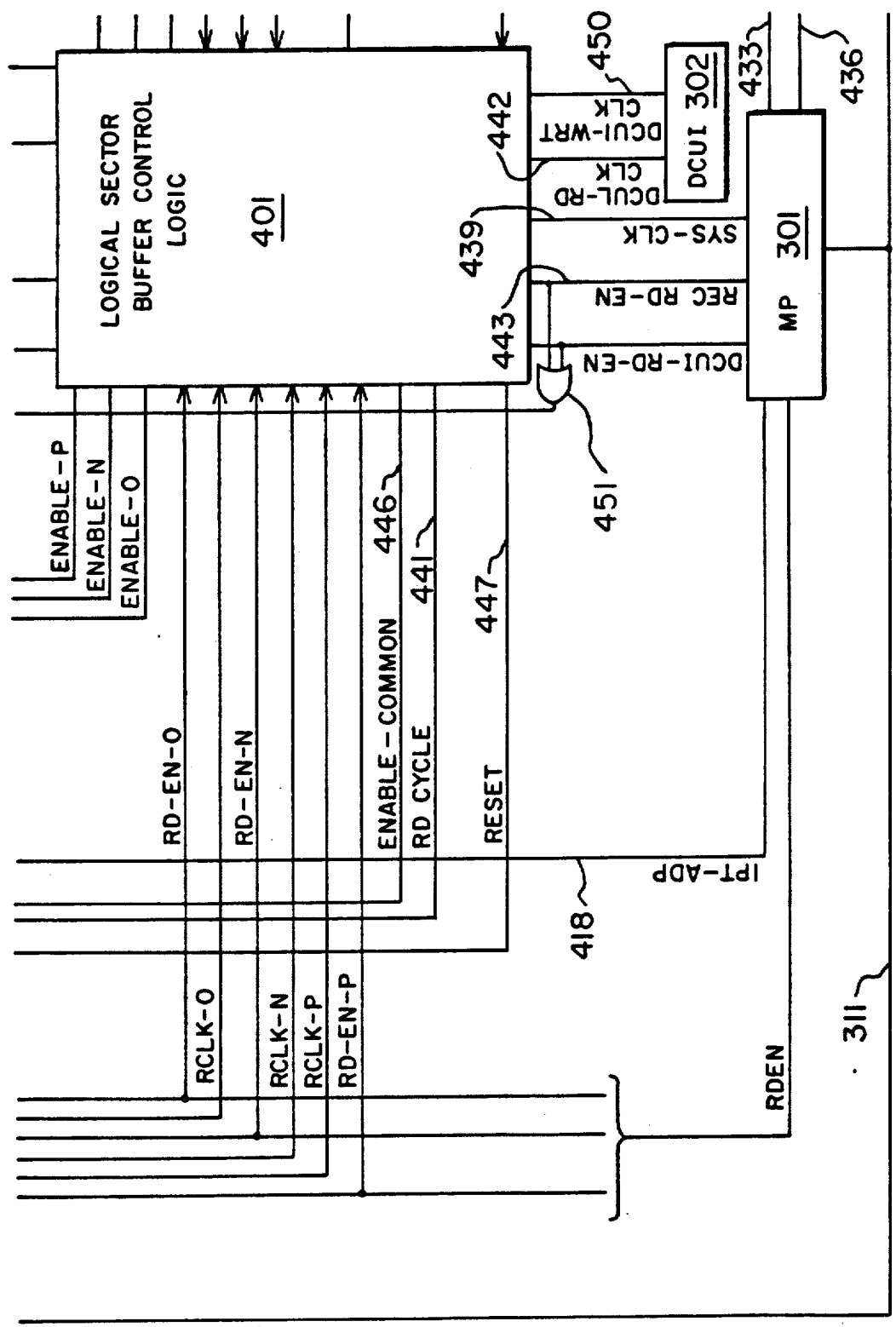

A typical prior art data processing and storage system having peripheral DASD memory facilities is shown on FIG. 1. The system comprises a mainframe computer 100 having a central processing unit (CPU) 101, a main storage or memory 103, and a channel unit 102. The system further comprises a disk control unit (DCU) 106 and a disk controller 108 which is connected to and controls a plurality of physical disk drives 109-0 through 109-m. Path 104 interconnects channel unit 102 with DCU 106. Path 104 may be a standard I/O interface. Path 104 may also connect to a plurality of other DCUs not shown.

Path 107 interconnects DCU 106 with disk controller 108 as well as with a plurality of other disk controllers (not shown), if desired. Path 107 may be a standard DASD interface. Disk controller 108 is connected to the physical disk drives 109 by means of an interface 110 which is well known in the art.

All elements of FIG. 1 are well known and the DASD system therein may comprise for example the DASD system shown in the aforementioned Ouchi patent or the DASD system of U.S. Pat. No. 4,875,155 of Oct. 17, 1989, to Iskiyan et al. In one possible preferred embodiment, CPU 101 may be an Amdahl V8 connected to a STK (StorageTek) 8880 Disk Control Unit 106 via I/O interface 104. The STK 8880 may be connected to a STK 8380E Disk Subsystem Model A4 which includes a STK 8381 disk controller and 8380E disk drives. All of the drives are connected to the disk control unit 106 by STK disk control interface 108. The details of the STK 8880 structure and operations are shown in the STK maintenance publication entitled "8880/8890 Disk Storage Control Subsystem Product Description Manual © 1988. The details of the STK 8380 structure and operations are shown in the STK maintenance publication entitled "8380/8380E Disk Drive Subsystem Product Description Manual © 1987, 1989. These publications are available from the Storage Technology Corporation, whose address is 2270 South 88th Street, Louisville, Colo. 80028.

The functions of the units shown in block form and their interrelationship is generally well know in the art and hence, are only briefly summarized herein.

In the system of FIG. 1, operations requiring logical and arithmetical decisions are performed within CPU 101 in the problem state. For I/O operations, CPU 101 must be in the supervisory state. CPU 101 changes from the problem state to the supervisory state in response to either a program initiated supervisory call instruction or when a device initiated interrupt occurs. When in supervisory state, the CPU can execute a number of I/O instructions such as a start I/O, halt I/O, and halt device. The format of the instructions includes one byte to define an operations code and two additional bytes to define the channel, disk control unit, and device addresses.

In a manner well known in the art, channel unit 102 directly controls the I/O devices and the disk control unit 106 in accordance with a string of channel command words (CCW) and a channel program which are set up in the CPU and main storage 103 by the operating system for a suitable application program. After channel unit 102 has received a start I/O command from CPU 101, it fetches a channel address word (CAW) which is a four-byte word located in a specific location in CPU main storage 103. Three bytes are used to define the address of the first CCW in the chain of CCW's located in main storage 103. Channel unit 102 fetches the first CCW from the address specified by the CAW. The CCW is eight bytes in length. One byte is used to identify the specific command. Three bytes specify the storage main storage 103 address involved in the operation. Two bytes define the number of bytes in main storage to be involved in the operation. After receiving the CCW, channel unit 102 selects a specific peripheral storage device by sending the device address to all attached disk control units. If the selected device 109 is available, the command code for the CCW is sent to the disk control unit 106 which returns an initial status byte to channel unit 102 indicating the device is available. If the selected device 109 indicates busy in the initial status byte, a signal is sent to the CPU and the command is issued again a short time later. Disk control unit 106 can execute a series of CCW's from a single start I/O instruction by activating a predefined bit in the each CCW. This function is referred to as command chaining.

The data transferred between the CPU main storage 103 and the drives 109 may also be chained. This permits blocks of data to be transferred when they are in non-adjacent CPU storage locations. The next CCW in the channel program is normally taken from an address eight storage addresses higher than the current CCW, except that in a search command, provision is made to skip one CCW if the search is successful. A transfer in channel command (TIC) specifies the main storage 103 location of the next CCW. The next CCW can be specified in any valid CPU location. The above two instructions provide for limited branching capability within the channel program. Several different types of CCW's exist and can be sent from the channel. Control commands do not involve a transfer of data records between DCU 106 and main storage 103. However, in certain operations control bytes are transferred from main storage to the DCU.

During the execution of certain control commands, such as a search command, channel unit 102 operates in write mode to write head position information to DCU 106 while the DCU 106 operates in read mode to read head position information from the specified device 109. The DCU 106 compares the data coming from main storage 103 against the incoming data from the drives 109. When the search requirement has been satisfied (for example, a compare equal, high, etc) DCU 106 returns a status modifier bit in the status byte with channel end and device end indicator bits. This bit causes channel unit 102 to skip the following CCW in the chain and fetch the next CCW from a storage location 16 addresses higher than the current CCW.

Each search command, which verifies a device head position to locate a record, operates on one record at a time. To search another record, the command must be re-issued. This is normally done by chaining a TIC command to the search CCW as follows:

Search Key Equal
TIC *−8
Read Data.

If the search is unsuccessful, the TIC command following the search command causes the search to be repeated. When the search is successful and the desired record is located, the status modifier causes the TIC command to be skipped and the read data command to be executed.

A read command transfers information from disk units 109 to CPU 101. A read command may operate in either single or multiple track mode. On all read commands, a check is made of the error correction code bytes appended to the record to be read to determine the validity of each record area as it is transferred. After the correction bytes have been examined and data validity is established., disk control unit 106 sends an ending status byte indicating channel end and device end signals to channel 102.

Write commands used by the system of FIG. 1 are of two types, format write and update write. Format write commands initialize and write tracks and records on drives 109 and establish the length of the area within each record. Error correction code bytes are calculated and written after each record area.

The format write commands are:
Write Home Address
Write Record 0 (R0)
Write Count, Key, Data
Write Special Count, Key, Data
Erase.

Update write commands are used to update existing records and must operate on previously formatted tracks.

The update write commands are:
Write Key, Data
Write Data.

The system of FIG. 1 uses sense I/O and test I/O commands to identify the status of the DASD subsystem and identify any specific errors or unusual conditions that have occurred. The test I/O command is automatically generated by channel unit 102 when it requires status information or is the result of a test I/O instruction. In either case, it appears to disk control unit 106 as a command byte of all zeros and is treated as an immediate command. Test I/O requests disk control unit 106 to send all outstanding status information to the channel unit 102 and normally presents an all-zero status byte. A description of the various CCW's employed in connection with the system shown in FIG. 1 can be found in the STK 8380 Disk Drive Subsystem Product Description Manual, ED-065.

Disk controller 108 and disk drives 109 are shown as individual units in FIG. 1. In practice the units are usually packaged as one unit. The channel commands are translated into a set of primitive command/modifier tag/bus commands and sent to disk controller 108 which directs the execution of a specified drive to perform the commands. After the command has been executed by the specified drive, disk controller 108 returns a normal end (command complete) signal to disk control unit 106. If the command cannot be executed properly, disk controller 108 returns a check end/error alert (command incomplete) to disk control unit 106. If a data transfer is being performed, the data is streamed over the interface to or from DCU 106 and to or from a drive 109 based upon read/write clocks generated in drive 109 and passed through disk controller 108 to DCU 106.

Each track on a disk drive 109 is defined by a cylinder number (CC) and a head number (HH) while a record on the track is defined by a record number (Rn). As each record is entered into the system, a directory is established identifying in terms of the track address (CCHHR) where the data of the record is to be stored on the drive 109. In addition, the length of the record in terms of the number of bytes is recorded in the system along with the data on the drive 109. This information is used by the application program in constructing CCW chains which control the transfer of data between the storage system and CPU 101. It is to be understood that the track format of each drive is the well known IBM plug compatible count-key-data (CKD) format, which is the usual data format for disk drives in the industry. The foregoing brief description of the function of transferring data between a disk drive 109 and CPU 101 is today well understood in the art. A detailed description of the specific hardware used and its operations may be found in the previously cited publications as well as in publicly available IBM plug compatible publications.

Description of FIG. 2

FIG. 2 discloses the data storage system of the present invention which uses a plurality of physical disk units 209 to emulate the physical and operational characteristics of the large capacity vendor unique storage devices (virtual devices) 109 on FIG. 1. The system of FIG. 2 uses a plurality of multiple industry small capacity disk units 211 and 212 (physical devices). The system of FIG. 2 comprises a CPU 101, a channel unit 102, a main storage 103, interface path 104, a disk control unit 106 and an interface path 107. Elements 101 through 107 are identical to the comparably designated elements shown on FIG. 1. The system of FIG. 2 further comprises a plurality of logical disk units 209-0 through 209-n. Each logical disk unit 209 comprises a logical disk unit controller, such as controller 210-0 for logical disk unit 209-0, and further comprises a plurality of physical disk units which for logical disk unit 209-0 are designated 211-0 through 211-N and 211-P.

Each logical disk unit, such as 209-0, moves its individual physical disks in rotational synchronism and in tandem so that the bytes of a virtual track received by the unit 209 on channel path 107 from DCU 106 are transferred to the physical disk units 211 as a parallel data transfer. A parallel data transfer may be defined as the simultaneous data transfer of the bytes of a virtual track on path 107 across the synchronized physical disk units 211 of logical disk unit 209. In other words, the individual bytes the comprising the virtual track are applied to or read from the N physical disk units 211 and 212 of the logical disk unit 209. The parity for the virtual track is received from or transmitted to the physical disk unit 211-P.

Description of FIG. 3

FIG. 3 discloses further details of a logical disk unit of FIG. 2 such as, for example, logical disk unit 209-0. The logical disk unit on FIG. 3 comprises microprocessor 301, disk control unit interface (DCUI) 302, logical sector generator 303, a plurality of device interfaces (DEVI) 304-0 through 304-N and 304-P, together with a corresponding number of physical disk units 211-0 through 211-N and 211-P. Microprocessor 301 is a standard industry available device such as, for example, an AMD 29000 device DCUI 302 is a traditional disk control unit control interface which receives read/write signals from microprocessor 301 as required to transmit data to/from disk control unit 106 (FIG. 2) based upon clocking controls received and generated by disk units 211. DCUI 302 also transfers data to/from logical sector generator 303 based on clocking controls received from the logical sector generator. DCUI 302 also provides status information to microprocessor 301.

Each DEVI (device interface) 304 is a traditional industry standard interface implementation which connects to industry standard 5¼" or 8" industry standard commodity disk drives 211. Each DEVI 304 comprises both non-read/write and read/write logic which receives selection, positioning, spindle synchronization, orientation, and read/write direction controls from microprocessor 301 to transmit data to/from industry standard disk drives 211 based on clocking controls received from the disk drives 211. Each DEVI 304 also transmits data to/from logical sector generator 303, and provides status information to microprocessor 301.

Synchronization path 307 interconnects all of the physical disk units 211 and, by means of internal circuitry in each disk unit 211, achieves spindle synchronization which keeps the track index areas of the physical devices to within the tolerances of buffers within logical sector generator 303. The spindle synchronization circuitry is internal to each industry standard physical device 211 and is an inherent part of each device and therefore need not be described in further detail.

DCUI 302 may be the DCUI shown in IBM publication "3830 Storage Control Model 2" © 1973. DEVI 304 may be an enhanced small disk interface (ESDI) using National Semiconductor drivers 74LS38, plus receivers 74LS 240 plus disk data controller data chips DP 8466 as shown on page 9-95 of the "National Semiconductor Handbook" published 1988. The physical disk units 211 may be Maxtor P-13 devices The logical disk unit of FIG. 3 receives over channel path 107 the virtual track information that originates in CPU 101. This virtual track information is received by DCUI 302, passed to logical sector generator 303 and distributed by logical sector generator 303 to the plurality of device interfaces 304 for storage on the physical disk units 211. Let it be assumed, for purposes of illustration, that there are two device interfaces 304 and two associated physical disk units 211 as well as an interface 304 and disk unit for parity. In this case, the alternate bytes of the virtual track received by logical sector generator 303 from DCUI 302 are distributed alternately byte by byte to the two physical disk units 211 in such a manner that a first one of the physical disk units 211 (211-0) stores the even numbered bytes while a second one of the physical disk units (211-N) stores the odd numbered bytes. By means subsequently described in further detail, as each pair of bytes is stored on the pair of disk units 211, the parity for the pair of bytes is generated and stored on physical disk unit 211-P.

The system of FIG. 3 is also used on a disk 211 read operation to read the bytes stored on the pair of disk units 211-0 and 211-N and to recombine the bytes into information comprising a virtual track for transmission via path 107 back to CPU 101. In this case, the bytes are read from the physical disks 211, stored temporarily within logical sector generator 303, and transmitted over path 308 to DCUI 302 which applies the virtual track information to path 107 for transmission to CPU 101.

Path 313 exchanges information between microprocessor 301 and DCUI 302. Path 312 exchanges information between microprocessor 301 and logical sector generator 303. The paths 311 permit microprocessor 301 to exchange information with the device interfaces 304. Paths 309 permit the logical sector generator to exchange bytes representing the virtual track between logical sector generator 303 and device interfaces 304. Path 308 permits the logical sector generator 303 to exchange virtual track information with DCUI 308.

Description of FIGS. 4-7—Logical Sector Generator 303

FIGS. 4 through 7, when arranged as shown on FIG. 8, disclose further details of logical sector generator 303 as well as the elements on FIG. 3 with which the logical sector generator communicates. Logical sector generator 303 is shown on FIGS. 4-7 as comprising logical sector buffer control logic 401, a plurality of input gates 402, a plurality of input buffers 403, exclusive OR gate 404, a plurality of AND gates 406 and logical sector buffer 407. As is further described in detail, elements 403 through 406 are on the input side of the logical sector generator and they receive information that is read out of the physical disk units 211 via interfaces 304 for transmission to DCUI 302. Information read out of the physical disk units 211 via interface 304 is processed by elements 402-406 and applied, as subsequently described in detail, to logical sector buffer 407 which is of a sufficient size to store the readout bytes of a logical sector. These readout bytes comprise a plurality of bytes of a virtual track. The readout virtual track information entered into logical sector buffer 407 is subsequently read out and applied via MPX2 to DCUI 302 over path 429.

Logical sector buffer 407 may also receive virtual track information from DCUI 302 over path 428 and MPX1. This information is temporarily stored in logical sector buffer 407. It is then read out of logical sector buffer 407 and applied via MPX2 and the plurality of AND gates 413 to the DEVI devices 304 for storage on the physical disk units 211.

Logical sector buffer 407 is controlled in its operation by control signals generated by logical sector buffer control logic 401 and applied via address registers 421 and 422 to logical sector buffer 407. DCUI 302 also applies control signals to the input of logical sector buffer control logic 401. Input control signals are also applied to logical sector buffer control logic 401 by microprocessor 301. Control signals are applied by logical sector buffer control logic 401 to input AND gates 402, to input buffers 403, to AND gates 406, as well as to output AND gates 413.

The following paragraphs describe the specific function of each of the various conductors and conductor groups on FIGS. 4, 5, 6 and 7. This description is not in a sequence representing a physical device 211 read or write operation.

Input AND gates 402 are designated 402-0 through 402-N and 402-P. Each of these input AND gates is functionally associated with one of the physical disk units 211-0 through 211-N and 211-P. On a read operation, the bytes that are read out of the disk units 211 are transmitted to input AND gates 402. Each such AND gate (which actually comprises eight gates) has three inputs, namely, a lower enable input, a middle clock input, and an upper eight byte data input. A particular AND gate 402 is enabled when its lower enable lead is active while a clock signal is concurrently applied by its associated disk unit 211 to its middle input. At such times, the 8 bits representing a data byte on its upper input are passed through the enabled AND gate, extended over output 414 of the AND gate to the input of the buffer 403 associated with the enabled AND gate.

Leads RD-EN-0→RD-EN-N, RD-EN-P are connected to the lower inputs of input AND gates 402 and are enabled by microprocessor 301 whenever a read from physical disk units 211 is to take place. Leads RCLK-0→RCLK-N, RCLK-P connected to the middle inputs of input AND gates 402 are enabled by the associated physical disk units 211 whenever a data byte is read out of the disk units 211. Leads RDATA-0→RDATA-N, RDATA-P are connected to the upper inputs of input AND gates 402 and are loaded with a data byte by the physical disk units 211 with a data byte whenever the corresponding RCLK lead and RD-EN lead are both enabled.

Elements 403 are two byte buffers. Whenever conductor RD-CYCLE 441 and enable conductor 446 are enabled by logical sector buffer control logic 401, and conductor RD-CLK is enabled by the corresponding physical disk 211, the data byte on conductor RDATA from the corresponding physical device to its AND gate 402 is loaded into the input side of a buffer 403 on path 414. When the WRT-CYCLE lead 416 is enabled by logical sector buffer control logic 401, the data bytes in the input side of a buffer 403 are copied to the output side of the buffer 403. This implementation assumes that there is no skew in the spindle synchronization of the physical devices 211. If there is skew in the spindle synchronization logic, then the depth of buffers 403 is increased to match the size of the skew.

The output of buffers 403 is applied via AND gates 406 and over path 419 and MPX1 to the input of logical sector generator 407. Each AND gate 406 has a lower enable input which is activated by a signal on a path 417 from the logical sector buffer control logic 401. The upper input of each AND gate 406 receives a data byte from its associated buffer 403. With the lower enable input of an AND gate 406 activated, the data byte on its upper input 416 is extended over output path 419 common to all gates 406 and via MPX1 to the input of logical sector buffer element 407. AND gate 406-0 receives its data byte directly from the output of buffer 403-0. AND gate 406-N receives its input data byte directly from the output of buffer 403-N. AND gate 406-P receives its input data byte representing the parity of the other two data bytes from exclusive OR gate 404. Exclusive OR gate 404 has inputs extending to conductors 416-0 and 416-N as well as conductor 417 which receives the data byte stored in buffer 403-P.

The various ones of AND gates 406 are activated sequentially by the enable conductors 417 from logical sector buffer control logic 401 so that logical sector buffer input path 419 receives bytes from the physical disks 211 sequentially, byte by byte, so that buffer 407 receives only one byte's worth of information at a time and so that the signals representing more than one byte are not concurrently extended through AND gates 402, buffers 403 AND gates 406 to path 419 to conflict with each other. The parity circuit comprising exclusive OR gate 407 is used during parity reconstruction on a disk read operation to regenerate data bytes for a failed physical device 211. The reset lead 447 is enabled by logical sector buffer control logic 401 to reset the output side of parity buffer 403-P to zero. Buffer 407 can also receive data bytes from channel 107 via DCUI 302, path 428, and the upper input of MPX1.

Logical sector buffer 407 is an N byte buffer which is used to receive and store the bytes received from devices 211 by the input side of logical sector generator 303 of FIGS. 4-7. Logical sector buffer 407 matches the higher speed of the logical disk units 211 to the channel path 107. Let it be assumed that the speed of data channel 107 is such that it can accommodate data transmission rates of from 3 megabytes to 4½ megabytes per second. Let it also be assumed that the physical devices 211 have a data exchange rate of 1½ megabytes per second. Let is also be assumed that, excluding parity, two physical units 211 are used to store the virtual track information. The two devices 211 taken together have a data rate of 3 megabytes per second. Since the two devices 211 work cooperatively on both a device read operation as well as on a device write operation, the two devices 211 taken together can receive data transmitted to them over channel 107 at a 3 megabyte per second rate or alternatively, they can read out data and apply it to channel 107 at a 3 megabyte per second rate. In an analogous manner, three such devices could be used to utilize the full 4½ megabyte per second data rate of channel 107.

The length of logical sector buffer 407 is dependent on 1) the number of physical devices 211 used in each logical disk unit 209, and 2) the transfer rate of the individual physical disk units 211. Buffer 407 must be able to store an entire logical sector. When WRT-CYCLE conductor 416 is enabled by logical sector buffer control logic 401, a data byte is transferred from a buffer 403, via an associated AND gate 406 to conductor 419 and MPX1 into the logical sector buffer 407 at the buffer location addressed by the IPT-ADR register 421. In other words, logical sector buffer 407 receives sequentially the bytes stored in the various ones of buffers 403 and temporarily stores these bytes. The sequence is controlled by the sequence in which AND gates 406 are enabled. The bytes in the buffers 403 are read out and applied to AND gates 406. They pass through AND gates 406 and are applied via MPX1 sequentially to the input of logical sector buffer 407 on path 419. Each byte applied to input path 419 is entered into a section of buffer 407 specified by the input address register 421 whose output is applied to the logical sector buffer 407 over path 408.

When the RD-CYCLE conductor 438 extending to the bottom of buffer 407 is enabled by logical sector buffer control logic 401, the bytes stored in buffer 407 are read out. Logical sector buffer 407 is read out byte by byte under control of address information applied to buffer 407 over path 409 from output address register 422. The bytes read out of buffer 407 are applied via multiplexor MPX2 to either DCUI 302 via path 429 or to AND gates 413. The bytes pass through gates 413 under control of the gating and enable signals applied to gates 413.

The IPT-ADR register 421 is an n byte register used to address the logical sector buffer 407 for an operation in which buffer 407 receives data. The received data is stored in buffer 407 at the address specified by register 421. When the INCR lead 423 is enabled by logical sector buffer control logic 401, the IPT-ADR register 421 is incremented. The size of n is determined by the depth of the logical sector buffer.

The OPT-ADR register 422 is an n byte register used by microprocessor 301 to load the initial address in the LOGICAL-SECTOR-BUFFER 407 that is to be accessed for an operation in which data is read out of buffer 407. Output register 422 is used by microprocessor 301 to address the logical sector buffer 401 for a device write operation. When path INCR 424 is enabled by logical sector buffer control logic 401, the OPT-ADR register 422 is incremented. The size of n is determined by the depth of the logical sector buffer 407.

Path OPT-ADD 423 is used by microprocessor 301 to load into register 422 the initial address of the logical sector buffer 407 that is to be accessed to read out bytes from buffer 407.

The parity circuit comprising exclusive OR gate 411 and buffer 412 on the output side of the logical sector generator of FIGS. 4-7 is used during write operations to generate the parity to be written to physical device 211-P. Reset (RS) conductor 426 is enabled by logical sector buffer control logic to reset parity buffer 412 to zero.

Conductor MP-WRT-EN 436 extending to output AND gates 413 is enabled by microprocessor 301 whenever a write to the physical devices 211 is performed. This primes output AND gates 413. This signal also causes MPX2 to connect its input to its output conductor 427. Conductors 448, WRT-CLK-0→WRT-CLK-N, WRT-CLK-P, are enabled by the associated physical device 211 when the device 211 is ready to receive a data byte on the associated path WRT-DATA 449. Conductors 449, WRT-DATA-0→WRT-DATA-N, WRT-DATA-P, receive the data bytes to be written to a physical device 211 whenever the corresponding WRT-CLK path 448 is enabled.

In partial summary, logical sector buffer 407 receives a logical sector's worth of information at a given time.

This information may be received via MPX1 from DCUI 302 over path 428 or from physical devices 211 via path 419 and MPX1. The bytes stored in logical sector buffer 407 can be read out via MPX2 and applied to DCUI 301 over path 429 or can be applied to output AND gates 413. AND gates 413 also have clock inputs which receive clock signals from the associated physical devices 211. AND gates 413 also have enable inputs which receive enable signals from microprocessor 301. AND gates 413 also have inputs which receive enable signals on paths WEN-0—WEN-N and WEN-P from logical sector buffer control logic 401. The various enable signals and the clock signals ensure that each byte on path 427 from MPX2 to the input of each AND gate 413, is applied through only one of the enabled AND gates 413 to the associated physical device 211. In other words, each data byte on path 427 is intended for a specific physical device 211. The circuitry on FIGS. 4-7 ensures that each data byte on path 427 is applied to the correct physical device by causing only the required one AND gate 413 to be activated by the enable and clock signals when the data byte appears on path 427. The enable signals from logical sector buffer control logic 401 cause the correct sequencing of AND gates 413 to steer each byte on path 427 to the correct physical device 211 via its associated DEVI 304.

Conductor MP-WRT-EN 436 is enabled by microprocessor 301 whenever data is being transferred from buffer 407 to DCU 106. The upper output of MPX2 is then active so that data read out of buffer 407 is applied via path 429 to DCU 106 via DUC1 302. Conductor DCUI-RD-EN 431 is enabled by microprocessor 301 whenever data is transferred from DCU 106 to buffer 407. This activates the upper input of MPX1 so that the data read out of DCU 106 can be entered into buffer 407 via DCUI 302. Conductor REC-RD-EN 443 extending to the bottom of logical sector buffer control logic 401 is enabled by the microprocessor whenever a DCU recovery read is enabled upon a parity failure. The lower input of MPX1 is then active. Conductor DCU1-RD-CLK 442 extending to element 401 is enabled by DCU1 302 whenever a byte is read from logical sector buffer 407. Conductor DCU1-WRT-CLK 450 is enabled by DCUI 302 whenever a data byte is written to logical sector buffer 407 from DCUI 302. Path DCU1-RD-DATA 429 extending from MPX2 contains the data bytes read out of buffer 407 to DCUI 302 whenever path DCU1-RD-CLK 442 is enabled. Path DCU1-WRT-DATA 428 extending to the upper input of MPX1 contains the data bytes written to buffer 407 whenever path DCU1-WRT-CLK 450 is enabled. Path SYS-CLK 439 is enabled by microprocessor 301 to control the logical operation of logical sector buffer control logic 401, particularly when CLK bytes from a device 211 which is not operational must be inserted. During parity reconstruction, the SYS-CLK lead 439 is used to gate the regenerated data byte from buffer 403-P to logical sector buffer 407.

Logical sector buffer control logic 401 provides the sequencing to perform the normal read, recovery read, and normal write operations of the logical sector generator 303. Logical sector buffer control logic 401 controls the logical sector buffer 407 read and write cycles and synchronizes the operation of buffer 407 with the transfer of data through the logical disk unit. After a record is transferred to the logical sector buffer 407 from DCU 106 via DCU1 302, buffer 407 is read out and a parity byte is automatically generated by the parity generator elements 411 and 412. The parity byte is then transferred via AND gate 413-P to physical device 211-P.

Figure 6:
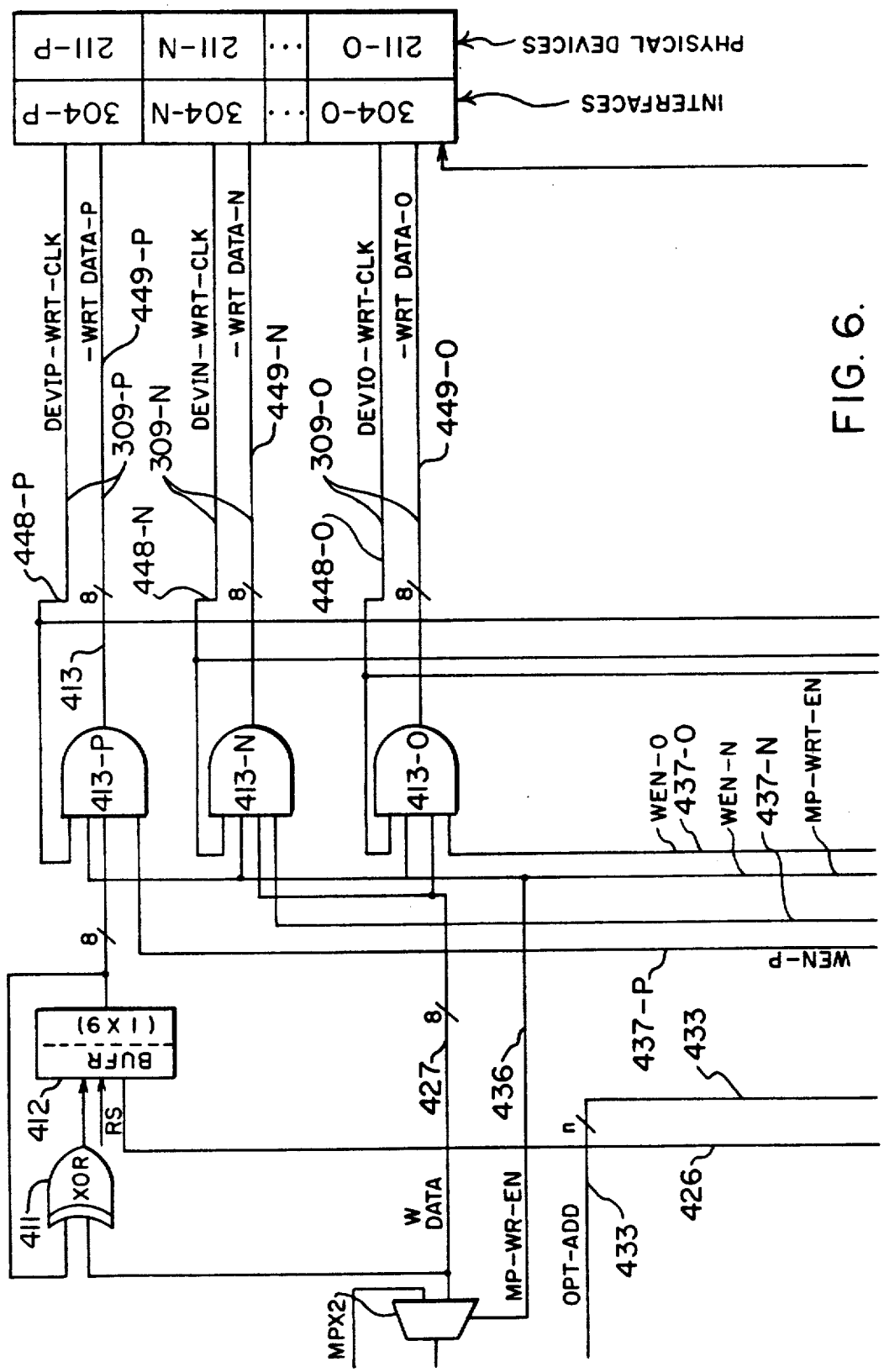

Physical devices 211 and interfaces 304 are shown both on the left side of FIG. 3 and on the right side of FIG. 6 to minimize drawing complexity. DCUI 302 is shown both on FIG. 4 and FIG. 5 for the same reason.

The control signals generated by microprocessor 301 and applied to various circuit elements on FIGS. 4-7 are shown as being extended over separate paths. This showing would require a decoder in microprocessor 301 to apply each signal to its required path. Obviously, if desired, a common family of busses (data, address, etc.) could be used to connect microprocessor 301 with the circuits it controls with the control signals then being extended over the busses and received and decoded in each circuit controlled by the microprocessor.

Path 311 connects microprocessor 301 with interfaces 304 so that these elements may exchange the signals required for the operation of interfaces 304 and physical devices 211.

Description of a device 211 read operation

The following describes how data bytes stored in physical disk units 211 are read out and applied to the circuitry of FIGS. 4-7.

Microprocessor 301 enables conductors (432) RD-EN-0→RD-EN-P extending to the lower inputs of AND gates 402 which permits each of the physical devices 211 to take part in a read operation to apply data to buffer 407. Microprocessor 301 sets IPT-ADR register 421 via path 418 to the starting device interface address of buffer 407. Microprocessor 301 sets OPT-ADR register 422 via path 433 to the starting DCU 106 interface address of buffer 407. Microprocessor 301 enables conductor RD-EN 431 to logical sector buffer control logic 401 which indicates that a DCU 106 read operation is to be executed as buffer 407 is read out. This signal also activates the lower input of MPX1 via OR gate 451. As each data byte from a physical device 211 appears on a data path 434 as indicated by its RCLK lead, logical sector buffer control logic 401 causes each received byte to pass through an associated AND gate 402 and to enter the input side of input buffer 403 by enabling the READ-CYCLE path 437 on the input side of buffers 403. In other words, when the physical devices 211 are to be read out, microprocessor 301 first enables path 431 extending to logical sector buffer control logic 401. It also applies a signal over path 311 to interfaces 304 instructing devices 211 to read out their stored data. The signal on path 431 advises logical sector buffer control logic 401 that a physical device 211 read operation is to take place. Microprocessor 301 also enables enable conductors 432 of AND gates 402 to cause the data bytes that are applied by physical devices 211 to the input data conductors 434 to pass through AND gates 402 and over paths 414 to input buffers 403. RD-CYCLE path 441 is concurrently enabled by logical sector buffer control logic 401 to enable buffers 403 to receive the bytes extended through associated AND gates 402. Microprocessor 301 issues seek and read data commands to devices 211 over path 311. The logical sector buffer control logic 401 is waiting for signals on the read clocks leads to indicate when data is present on the data leads 434 extending to AND gates 402.

Logical sector buffer control logic 401 enables the WRITE-CYCLE path 416 extending to buffers 403 to cause the data bytes received by the buffers on paths 414 to be copied from the input side of each buffer 403 to the output side of each buffer 403. Logical sector buffer control logic 401 enables the leads 417 sequentially and causes AND gates 406 to pass data bytes from buffers 403 and to be loaded into the logical sector buffer 407 in the required sequence under control of address signal from register 421. Logical sector buffer control logic 401 controls the sequence in which the different AND gates 406 are enabled. As each byte is loaded into logical sector buffer 407, the IPT-ADR register 421 is incremented by logical sector buffer control logic 401 over path 423. Each data byte is subsequently read out of logical sector buffer 407, at the buffer address specified by OPT-ADR register 422, whenever path DCUI-RD-CLK 442 is toggled by DCUI 302. As each byte is read out of the logical sector buffer 401, OPT-ADR register 422 is incremented by path 424 and logical sector buffer control logic 401. The bytes read of out buffer 407 are applied via the upper output of MPX2 to path 429 extending to DCUI 302 for transmission to DCU 106.

The following describes an LDU recovery read operation which takes place when a physical device 211 is defective. A recovery read of physical devices 211 is similar to that of the above described read operation except that lead RDEN-P to AND gate 402-P is enabled by microprocessor 301 in place of the corresponding enable for the defective physical device 211. Lead REC-RD-EN 443 is enabled by microprocessor 301 to indicate to logical sector buffer control logic 401 that a recovery read is in process. Microprocessor is advised by a signal over path 311 from an interface 304 that a physical device 211 is defective. Logical sector buffer control logic 401 controls the input parity generator logic elements 403-P and 404 and 406-P to generate the required data byte and substitutes the generated data byte for the missing byte of the defective physical device 211. It does this by exclusive ORing the parity byte from AND gate 402-P and the good data byte from an AND gate 402 to generate the missing data byte of the defective physical device 211.

Description of a normal write to the physical devices 211

On a device 211 write operation and with reference to FIGS. 4-7, the logical sector generator 303 receives information from channel 107 and DCU 106 representing a virtual track. This virtual track information is to be written into physical disk units 211. On FIGS. 4-7, the virtual track information is received by DCUI 302 from channel 107 and passed over lead 428 to the upper input of multiplexor MPX1. The control input 431 of multiplexor MPX1 is activated at this time by multiprocessor 301 so that the upper input of the multiplexor is connected signalwise to its output extending to the input of logical sector buffer 407. The logical sector buffer 407 receives the bytes representing the virtual track in the same described for a device read operation. As each of the bytes are received from DCU 106, they are entered into the logical sector buffer and written to the devices 211 on a logical sector basis with at most a delay of ½ a logical sector plus logical sector overlap. After the virtual track bytes are received and entered into logical sector buffer 407, it operates as subsequently described in detail to read out the information byte by byte and write each read out byte into the physical disk units 211.

A physical device 211 write operation begins when microprocessor 01 enables conductor 436 which extends to an enable input of each of AND gates 413. Each of AND gates 413 is associated with a different physical device 211 and the activation of the enable input 436 of each such AND gate 413 primes it for the writing of the bytes to its associated physical device 211. The microprocessor 301 enabled path MP-WRT-EN 436 also indicates to logical sector buffer control logic 401 that a device 211 write operation is to be executed. This path also extends to the control input of MPX2 to cause it to connect its input to its output 427 extending to AND gates 413.

Microprocessor 301 sets IPI-ADR register 421 via path 416 to the starting DCU interface buffer address of logical sector buffer 407 to prepare for writing of bytes into logical sector buffer 407 from path 428. Microprocessor 301 then sets OPT-ADR register 422 via path 433 to the starting device interface buffer address of logical sector buffer 407 to prepare for a read out of logical sector buffer 407.

Each data byte is transferred from DCUI 302 to the logical sector buffer 407 at the address specified by IPT-ADR register 421 whenever path DCUI-WRT-CLK 450 is toggled by DCUI 302. As each byte is loaded into logical sector buffer 407, IPT-ADR register 421 is incremented via path 423 from logical sector buffer control logic 401.

Microprocessor 301 enables path 436 to AND gates 413 while each data byte is sent to a physical device 211 on a path WRT-DATA 449 whenever a conductor 448 (DEV-WRT-CLK) is enabled by the associated physical device 211 that is to receive the data. As each byte is read out of logical sector buffer 407, OPT-ADR register 422 is incremented by logical sector buffer control logic 401 via path 424. As each data byte is read out of buffer 407 and written to a physical devices 211, logical sector buffer control logic 401 controls the output parity generator logic elements 411 and 412 and 413-P which generate the required parity byte, and writes the parity byte to physical device 211-P.

Thus, in summary so far regarding a write operation of the physical devices 211, the operation is initiated when microprocessor 301 enables enable lead 436 extending to one of the inputs on each of AND gates 413. Microprocessor 301 then causes the buffer 407 address registers 421 and 422 to be loaded with the correct address information. Address register 421 is loaded by the microprocessor over path 418. Address register 422 is loaded by the microprocessor with address information over path 433. The write enable lead 436 connected to logical sector buffer control logic 401 is enabled by microprocessor 301 to advise the logical sector buffer control logic that a write operation of the physical devices is about to take place. This same lead extends to the control input of multiplexor MXPX2 so that its input from the logical sector buffer 401 is connected signalwise to its lower output extending to AND gates 413.

Next, the information representing the virtual track is received byte by byte via MPX1 and loaded into logical sector buffer 407 under control of address register 421. When a plurality of these bytes are received representing a logical sector, the circuitry of FIG. 4-7 reads out logical sector buffer 407 byte by byte and distributes the read out bytes via AND gates 413 to the physical devices 211, each of which is associated with a different one of output AND gates 413 on FIG. 4.

Let it be assumed for purposes of simplifying the description that there are only two physical devices 211. The system of the invention operates in such a manner that the bytes sequentially read out of logical sector buffer 407 are distributed to the two physical devices 211 alternately and sequentially so that one physical device 211 stores the even numbered bytes and the other physical device stores the odd numbered bytes. Let it be assumed that the first byte, byte 0, is now read out of logical sector buffer 407 and extended through multiplexor MPX2 and over path 427 to an input of each of AND gates 413. Logical sector buffer control logic 401 now enables conductor 437-0 extending to an enable input of only AND gate 413-0. This prepares this AND gate to be turned on when a clock signal is received on its upper input from its associated physical device 211-0. At this time, since the data byte 0 is currently applied by path 427 to the corresponding input of all AND gates 413, data byte 0 is extended only through AND gate 413-0 and out over the data path 449-0 to its associated physical device interface and its associated physical device 211-0.

The next byte, byte 1, read out of the logical sector buffer 407 is extended through AND gate 413-N in a similar manner as logical sector buffer control logic 401 deactivates enable path 437-0 and activates enable path 437-N so that only AND gate 413-N now turns on and applies data byte 1 over its output conductor 449-N to its associated physical device 211-N. In this manner, the remaining bytes of the virtual track are transferred from logical sector buffer 407 and applied alternately through AND gates 413-0 and 413-N so that the two physical devices 211 associated with these AND gates receive and stores between them all of the bytes of the virtual track. AND gate 413-P applies a parity byte to physical device 211-P for each pair of byte applied to devices 211-0 and 211-N.

The parity generation circuitry comprising exclusive OR gate 411 and buffer 412 operates to generate a parity byte which is transmitted through AND gate 413-P in a manner analogous to that already described for the other AND gates 413. Exclusive OR gate 411 receives on its inputs the output of buffer 412 and the signals on path 427. Gate 411 generates an exclusive OR of this information which is applied to buffer 412 which stores the information until such time as it is to be extended through AND gate 413-P to physical device 211-P. The output of BUFR 412 is continuously presented to AND gate 413-P but until leads WEN-P and DEVIP-WRT-CLK are also enabled, the byte is not actually written to the devices 211-P.

Figure 9:
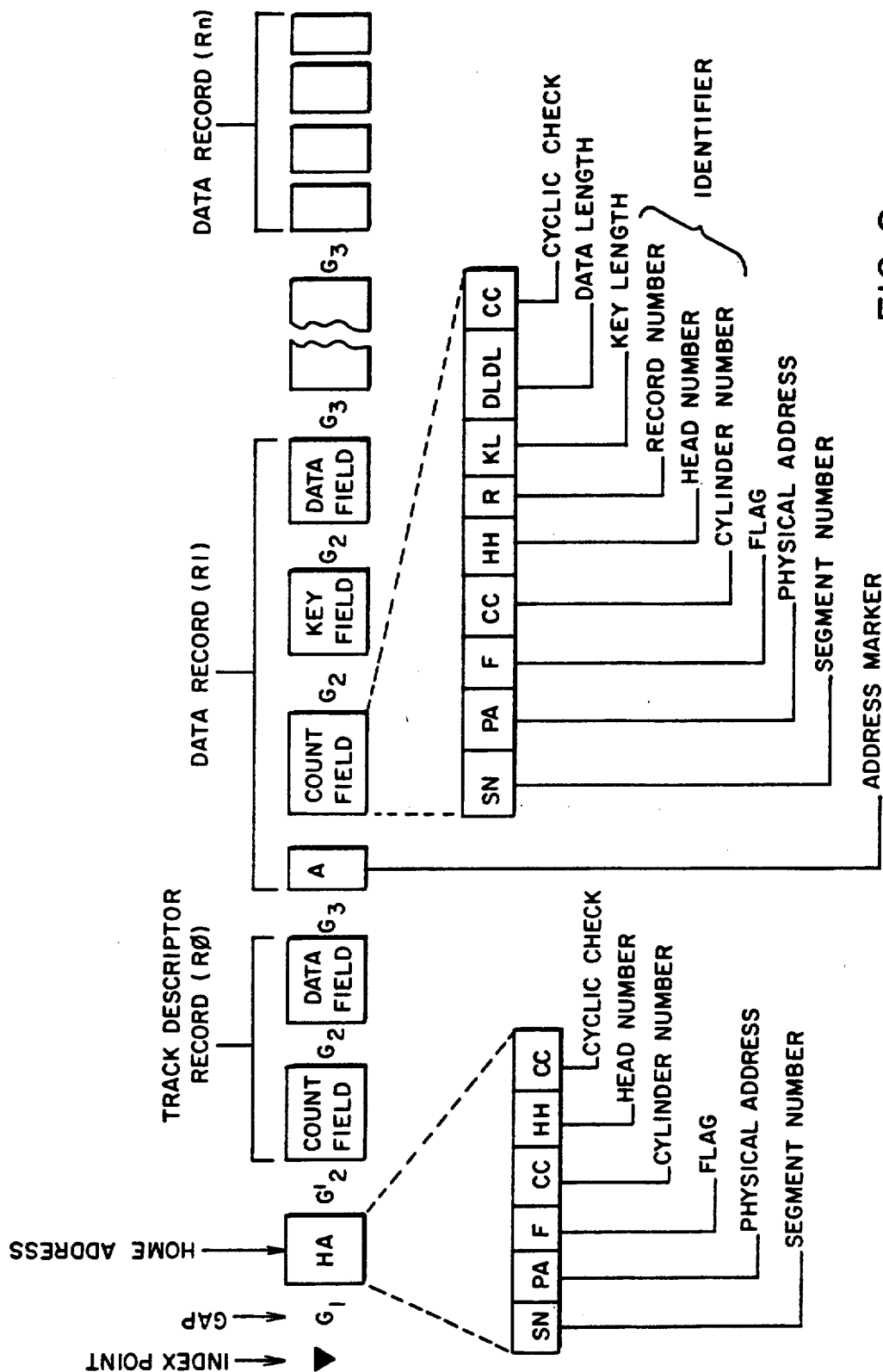
FIG. 9 discloses the industry standard IBM CKD format.

FIG. 9—Description of Virtual Track Format

The format for a virtual track for a large capacity high performance disk is shown on FIG. 9. This format is well known and is described in many IBM publications and is therefore only briefly described herein.

An index point, usually a unique bit pattern, is written on the Servo Track of a disk and indicates the start of the virtual track. A G1 gap separates the home address (HA) from the index point. In addition to providing the required head switch time (the time to switch between heads of the same cylinder), gap G1 provides the required channel 107/disk control unit 106 turnaround time required to transmit the next CCW command to DCU 106 and to program the DCU for any required subsequent data transfer operations.

The home address field is used by DCU 106 to identify the physical address (PA) of the virtual track and verify proper head positioning. The Flag (F) byte of the HA field indicates the physical condition of the track i.e., whether it is normal (good) or defective. The record identifier (CCHH) of the HA field is used by the operating system to verify proper head positioning. The SN subfield stores the segment number which is used for rotational position sensing operation.

The G2 gap separates the HA field from the count field of record R0. The other G2 gaps separates the count field from the data field for the other records. Each G2 gap provides the required channel/disk control unit turnaround time required to transmit the next CCW command to DCU 106, to program the DCU for any required subsequent data transfer operations, and to execute any required special processing associated with handling media defects.

Record R0 is the track descriptor record and it consists of two fields, the count field and a data field. The count field of record R0 is similar to the count field of record R1 which is shown in detail and is eight bytes in length plus the length of the SN, PA and F subfields. The SN, PA and F subfields are used in the same fashion as described for the HA Field. The usage of the remainder of the bytes of the count field of record R0 are defined in the description of the record R1 count field. The data field of record R0 is always eight bytes of zero for a normal track. If the track is a defective track, the data field contains the address of the assigned alternate track.

A G3 gap separates the address mark of the next data record from the data field for the previous data record. Gap G3 serves the same purpose as the G2 gap described above. The address mark is a specific bit pattern recorded on the track to allow orientation on an R1 through Rn count field.

The Records R1 through Rn are customer data records. Customer data records always contains a count field, and optional key field, and a data field. The count field is eight bytes in length plus the length of its SN, PA and F subfields. The SN, PA and F subfields are used in the same fashion as indicated for the HA field. The record identifier (CCHHR) of the count field are each two bytes in length and are used by the operating system to verify proper head positioning and establish head orientation. The key length subfield (KL) is one byte in length and defines the length of the subsequent key field. If the KL subfield is zero, there is no key field for the record. The data length subfield (DLDL) is two bytes in length and defines the length of the data field of the record. In the IBM CKD environment, data records written to a virtual track data field may be of any length from zero to track capacity.

Figure 10:
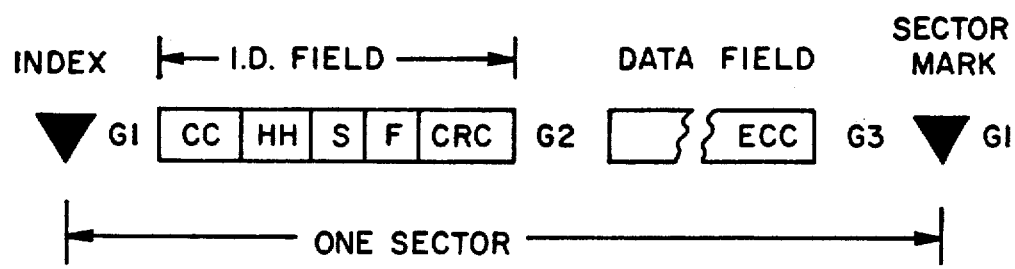
FIG. 10 discloses the physical and logical sector formats of the invention.

FIG. 10—Description of Physical sector format

The physical sector format for a physical device 211 is shown on FIG. 10. Devices 211 may be hard disk elements commonly used in personal computers.

An index point, usually a unique bit pattern written on the servo track, indicates the start of the first physical sector on a physical track. A G1 gap separates an identifier field (ID) from the index point. This gap provides the write-to-read transition time required to read the subsequent ID field and the time required for switching heads.

The ID field is used by a disk unit 211 as the sector identifier to identify the physical address (CCHHS) of the physical track of the disk to verify proper positioning and establish orientation. The flag (F) byte of the field indicates the physical condition of the sector, whether it is normal (good) or defective. A G2 gap separates the ID field of a sector from the data field for the same sector. This gap provides the required read-to-write and write-to-read transitions times.

The data fields of FIG. 10 store the bytes received from all fields of the virtual track of FIG. 9. The size m in bytes of the physical track of a device 211 is determined by the characteristics of the physical device 211 and may be assumed to be 512 bytes per sector.

A G3 gap separates the data field of a sector from the sector mark and G1 gap for the next sector and is added when required to allow for a speed tolerance in the physical device. A sector mark, usually a unique bit pattern written on the servo track, indicates the start of the next physical sector on the physical track.

FIG. 10—Description of logical sector format

The logical sector format for the logical disk unit comprising the invention is the format in which the virtual track information is stored by all physical devices 211 comprising the logical device. This format is also shown in FIG. 10. It is the same format as the physical sector devices except for the size of the data field.

Each logical sector contains an index point, G1 gap, ID field, G2 gap, and G3 gap. These are derived only from the first physical device 211 comprising the logical disk unit and these gaps and fields perform the same control function as do their physical sector counterparts.

The data field of each logical sector contains bytes received from the virtual track being emulated. The byte size of the logical sector is different from the size of the physical sector and may be defined as n×m where n is the number of physical devices 211 comprising the logical disk unit (not counting the parity device 211) and where m is the size of the physical sector in bytes which may be 512. The logical sector size of n×m could be 1024 bytes for a two device logical system (parity excluded) having 512 bytes per physical disk.

FIG. 11—Description of interleaved virtual track format

FIG. 11 shows a plurality of logical sectors of a single logical track of devices 211 and discloses how the bytes or segments of two virtual tracks are stored in an interleaved manner on a single logical track by the logical device of the present invention. The logical device of the invention is illustratively assumed herein to comprise two physical devices 211 for data plus a third physical device 211 for parity. Each rectangle on FIG. 11 represents a logical sector having 1024 data bytes provided by two physical devices 211 each having 512 bytes per physical sector. FIG. 11 discloses 20 such rectangles arranged into four rows of five rectangles each. The upper left rectangle represents the first logical sector for a single logical cylinder and head (track) such as, for example, logical sector on cylinder 00, head 0. This rectangle is designated 00-0-0 to represent logical cylinder 00, head 0, sector 0. All rectangles on FIG. 11 are associated with different sectors of the same logical track served by cylinder 00 and head 0. The logical sectors of FIG. 11 are differentiated from one another in this description only by reference to the last portion of the designation indicating the sector number, such as —0 for the first or upper left hand sector, —1 for the next sector to the right, etc.

The rectangle to the right of rectangle 00-0-0 is designated 00-0-1. This represents logical cylinder 00, head 0 and logical sector 1. The remaining rectangles on the top row are associated with logical sectors 2, 3 and 4 of cylinder 00 and head 0. The next five logical sectors on the same logical track (head) are portrayed by the five rectangles comprising the next row down. The subsequent logical sectors of this track served by cylinder 00 and head 0 are shown on the next two rows on FIG. 11 with the lowermost right rectangle representing the 20th logical sector and being designated 00-0-13 (hexadecimal). These sequentially designated logical sectors on FIG. 11 store the bytes received over channel 107 representing two different virtual tracks emulated by the system of FIG. 11.

These logical sectors of FIG. 11 store the bytes of two virtual tracks in an interleaved manner. The term "interleaved manner" means that adjacent logical sectors of FIG. 11 store information for two different virtual tracks. These virtual tracks are herein assumed to be associated with a virtual cylinder (track) 0, head 0 and a virtual cylinder 1, head 0. In other words, the logical sectors of FIG. 11 store the bytes of a virtual track on each of virtual cylinders 0 and 1. The logical sector that contains the count field for a virtual record precedes by two logical sectors the sector containing the data or key field for the same virtual record. Thus, sector —6 contains the count field for virtual record R1 of virtual cylinder 0, head 0, while the sector —8 contains the data field for the same virtual record. A two byte CRC for each of the HA, count, key, and data fields are assumed included as part of the virtual field and are not specifically shown on FIG. 11.

The first logical sector, sector 00-0-0 (cylinder 00, head 0, sector 0) and its associated gaps supply the G1 gap for the two virtual cylinders. The data field of logical sector 1 is partitioned into two sub-areas which store the 16 byte HA fields for the two virtual cylinders. The HA field in sector —1 comprises 16 bytes for each of the two represented virtual cylinders for a total of 32 logical bytes for sector 1. The rest of the bytes and byte times of sector 1 simulates the G2 gap of each virtual track emulated by the single logical track portrayed by FIG. 11.

The data field of logical sector 2 stores the virtual record R0 count field for virtual cylinder 0, head 0. Sector 3 stores the record R0 count field for virtual cylinder 1, head 0.

Based on the number of logical sectors that a key or data field of a virtual record spans, the next count field of a record for the same virtual cylinder is always separated by a multiple of 2 logical sectors from the logical sector which contains the current count field. Thus, sector 2 stores the record R0 count field for virtual cylinder 0, head 0. The next count field for a record on the same virtual cylinder and head is the record R1 count field for virtual cylinder 0, head 0. This record R1 count field is stored in logical sector 6. The two count fields for virtual records R0 and R1 are separated by four sectors.

The data field of logical sector 4 contains the data field of record R0 from virtual cylinder 0, head 0. If a key or data field spans multiple logical sectors on FIG. 11, the next key or data field is positioned 2 logical sectors from the current logical sector. In the example of FIG. 11, the data field of logical sector D contains the virtual record R2 key field for virtual cylinder 1, head 0. The data field for the same virtual record R2 is stored in logical sector F. Key and data fields are always written zero filled, modulo 2.

The remaining 20 sectors on FIG. 11 store the information indicated. Thus, sector A stores the record R2 count field for virtual cylinder 0, head 0. Sector B stores the record R2 count field for virtual cylinder 1, head 0. Sector C stores the record R2 key field for virtual cylinder 0, head 0. Sector D stores the record R2 key field for virtual cylinder 1, head 0. The record R2 data fields for virtual cylinder 0, head 0 and cylinder 1, head 0, are stored in logical sectors E and F, respectively. The next four sectors, namely sectors 10, 11, 12 and 13 (hexadecimal), store the record R3, count and data fields of virtual cylinders 0, head 0, and virtual cylinder 0, head 1. The count, key and data fields for additional virtual records on head 0 of virtual cylinders 0 and 1 would be stored in additional logical sectors not specifically shown on FIG. 11.

FIG. 11 shows only the first 20 logical sectors of the logical device comprising the plurality of physical devices of the present invention. There would be as many additional sectors on this logical device as there are additional physical sectors on the physical devices comprising the logical device. A typical physical disk unit of the type used in the present invention may have 85 sectors. These are not specifically shown, but they would store information analogous to that already described for subsequent virtual records on the virtual tracks being emulated and stored in an interleaved manner on the logical device portrayed by FIG. 11.

An interleave factor of two virtual cylinders was chosen because of the requirement to speed match to the transfer rate of a virtual device. It also efficiently provides for a simulation of the gap times of the virtual record as priorly explained. Current IBM channels transfer data at 3, 4.5, and 6.0 MB/s. There are currently no IBM physical devices that transfer faster than 4.5 MB/s. Assume that Maxtor P1-13 commodity disk drives are used for the physical devices. The Maxtor P1-13 has a data transfer rate of 3 MB/s.

Using two Maxtor P1-13 physical devices generates a logical device with a transfer rate of 6 MB/s. Interleaving two virtual tracks generates a virtual device with a channel transfer rate of 3.0 MB/s. Using three Maxtor P1-13 physical devices generates a logical device with a transfer rate of 9 MB/s. Interleaving two virtual tracks generates a virtual device with a channel transfer rate of 4.5 MB/s. Using four Maxtor P1-13 physical devices generates a logical device with a transfer rate of 12 MB/s. Interleaving two virtual tracks generates a virtual device with a channel transfer rate of 6.0 MB/s.

Figure 12:
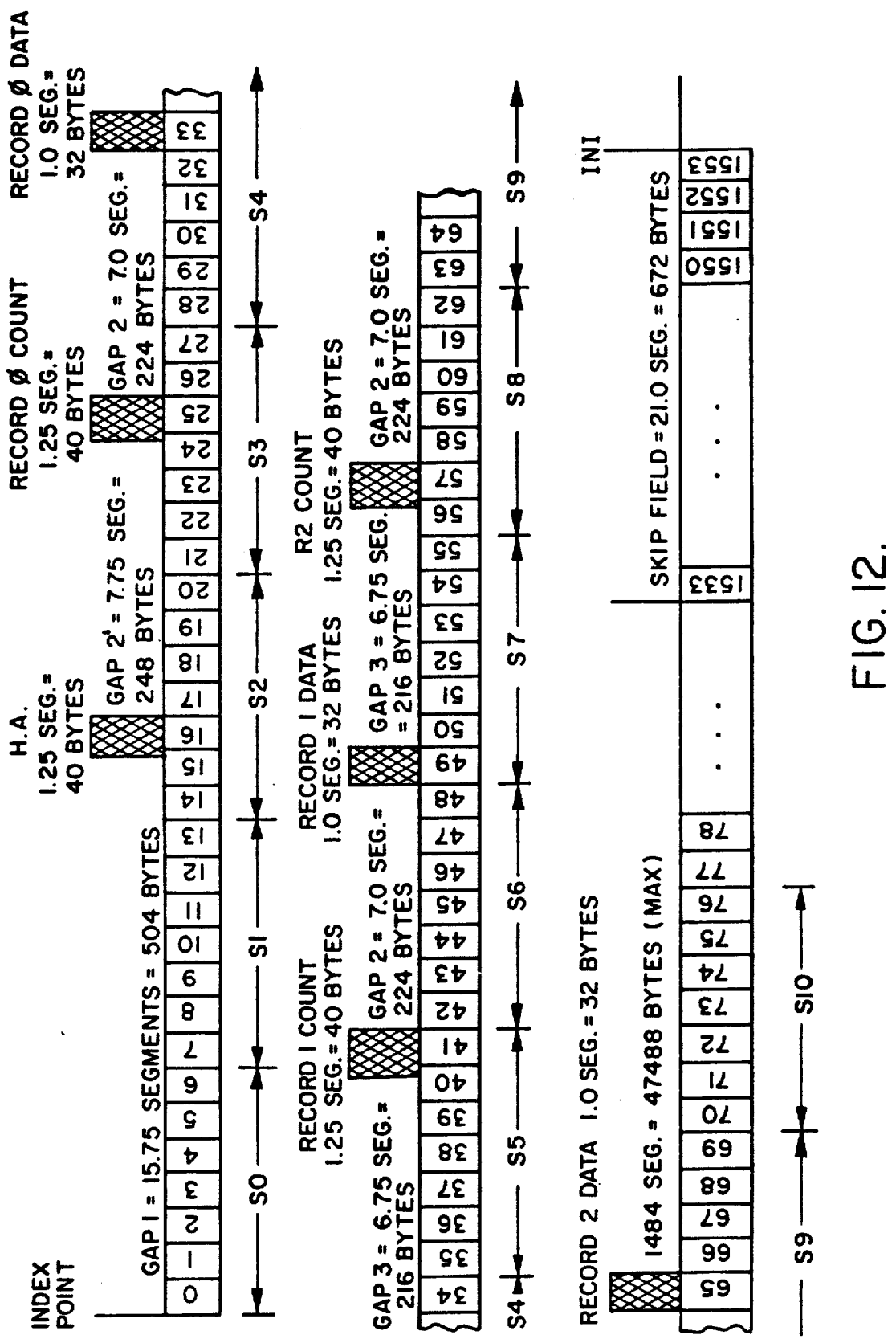
FIG. 12 shows how a virtual track having the virtual track format of FIG. 9 is divided into segments and sectors.

FIG. 12—Virtual Track Rotational Positioning Sensing

The following describes what is termed rotational positional sensing operations in the virtual device being emulated and how given the specifics of the virtual device's rotational position, the system of the present invention determines the equivalent physical device's 211 rotational positions. It is typical in high capacity, high performance virtual disks of the type being emulated by the present invention that these virtual disks contain "rotational position" sectors, each of which contains 224 bytes or byte times. If fixed length records are written to a track, the RPS sector number can be calculated for a record using the following formula:

$$S(n) = 1/224(1248 + SUM(KL(i) + DL(i)) + C, \text{ FROM } i=1, \text{ TO } i=n-1))$$

$C = 480$ if $KL = 0$.

$C = 704$ if $KL \neq 0$.

In the above expression: $KL$ = key field length;

$DL$ = data field length;
$i$ = record number
$C$ = constant.

One segment of a virtual CKD track is equal to 32 bytes as shown on FIG. 12. IBM uses segments for handling media defects. The logical disk unit 209 of the present invention uses segments to emulate RPS. Since a virtual CKD track stores records having variable size data fields, it must always be generated from index by writing record 1 before record 2 etc. As shown on FIG. 12, the following gap and field sizes are fixed for an IBM CKD track:

G1 = 504 bytes.
HA = 40 bytes.
G2' = 248 bytes.
R0-count = 40 bytes.
G2 = 224 bytes.
R0-data = 32 bytes.
G3 = 216 bytes.
Rn-count = 40 bytes.
G2 = 224 bytes.
Rn-key = User defined.
G2 = 224 bytes.
Rn-data = User defined.

The key and data fields of all records other than record R0 are user defined. The byte time offset from index for the count field of any record can therefore be calculated by adding up the various field sizes as shown on FIG. 12 which shows an IBM track having a plurality of segments. The segment number from index for the count field of any record can therefore be calculated by dividing the byte offset by 32 since there are 32 bytes in a segment. There always 7 segments per RPS sector. The RPS sector number can be calculated from a segment number by dividing the segment number by 7. A segment number can be calculated from a RPS sector number by multiplying the RPS sector number by 7. To emulate a set sector command in which a RPS sector number is specified, as subsequently described, calculate the segment number by multiplying the specified sector number by 7 and search for a segment number in the count field of a record which is equal to the calculated segment number. As soon as there is a match, return a command complete signal to DCU 106. To emulate a read sector command specifying a sector number, calculate the RPS sector number of the last count field accessed and return the calculated value of the new sector and a command complete signal to DCU 106. This is done by taking the sector number of the set sector command and adding the additional lengths for the fields processed.

As an example of the above calculations, and as shown on FIG. 12, the leading edge of the record R1 count field is located in segment number 40 (zero origin). Divide 40 by 7 to determine that the R1 count field is in RPS sector 5. The minimum segment number for RPS sector 5 is 5×7 or 35. The RPS sector number for segment number 40 is 40/7 or 5. Using the above calculations and assuming a minimum data field for R1 (32 bytes), the leading edge of the record R2 count field is located in segment number 56 (zero origin). The RPS sector from above is 8. The minimum segment number for RPS sector 8 from above is 56. The RPS sector number for segment number 56 from above is 8.

The vendor mainframe 100 generates what is known as seek and set sector commands and transmits these commands to the logical device of the invention to read or write physical devices 211. The receipt of these commands tells the logical system to return a message when the logical physical equipment is in the correct rotational position to read or write the record the mainframe is interested in. When the logical equipment is in the correct rotational position, it generates a command complete signal which is returned to the mainframe. In other words, upon the receipt of the seek and set sector commands, the foregoing calculations are used by microprocessor 301 to determine the logical sector number containing the specified virtual record. When the logical disk spins to the correct position, the command complete signal is generated with tells the mainframe that the logical disk is now in the correct position to read or write the virtual record the mainframe is interest in.

Description of a Virtual Track Read Operation

Logical cylinder (LC) and logical track (LT) addresses are directly related to their corresponding physical cylinder (PC) and physical track (PT) addresses. A logical sector of FIG. 11 is made up of the ID field from physical device 211 and a data field which is taken from the data fields of both physical devices 211-0 and 211-N. Since the physical devices comprising the logical device are spindle synchronized, only the ID fields from one physical device, such as 211-0 need be accessed since the ID fields of each other physical device such as 211-N, is identical. Virtual cylinder 0 (VC), virtual track 0 (VT) and virtual cylinder 1, virtual track 0 are assumed herein to be interleaved on LC 0, LT 0 as shown on FIG. 11.

A typical channel program that would be sent to virtual disk unit 109 to cause it to search a virtual track for the count field for VC 1, VT 0, record 1 and read the data fields for records 1 and 2 consists of the following channel command words:

Seek CCHH = X00010000
Set sector S = X05
Search ID CCHHR = X0001000001
("x" signifies a hexadecimal notation)
TIC *−8
Read data
Read data In the above seek command, the first four digits of 0001 following the x signify virtual cylinder 1, while the last four digits of 0000 specify virtual head 0. In the set sector command, the digits 05 specify virtual rotational positional sector 5. In the search ID command, the digits 0001 following the x specify cylinder 0. The next four digits of 0000 specify head 0 while the last two digits 01 specify record 1.

When the disk control unit 106 sends the seek command to the logical disk unit 209, microprocessor 301 in logical disk unit 209 translates the virtual seek address (CCHH X00010000) to the equivalent logical seek address (CCHH X00000000). This translation of virtual cylinder 1 head 0 to logical cylinder 0 head 0 is made since logical cylinder 0 head 0, as shown on FIG. 11, store the virtual tracks for heads 0 of virtual cylinders 0 and 1. The above seek command is translated by microprocessor 301 to a DEVI seek command which is issued to the physical devices 211 over the device interfaces 304 which move the heads of physical devices 211 to their logical cylinder 0 head 0 position. When the physical devices 211 return DEVI 304 command complete signals, the logical disk unit microprocessor 301 returns a DEVI 304 command complete signal to DCU 106 when this head positioning is completed. All physical devices 211 within the logical disk unit are always selected by the logical disk unit.

When DCU 106 sends the set sector command S = x05 to the logical disk unit 209, the logical disk unit microprocessor 301 translates the virtual sector address to the virtual track segment number by multiplying RPS sector number by 7 and begins searching the virtual track count fields for a match of the segment number by issuing a DEVI 304 read to each of the physical devices through the DP 8466 disk data controller. When a match is found, the logical device 209 returns a command complete signal. Assume a match of the desired segment number is found in logical sector 7 of FIG. 11.

DCU 106 next sends the search command (CCHHR = X0001000001) to the logical disk unit 209 to cause it to search for the logical sector containing the count field for virtual record 1 in rotational position sector 5 of the virtual track. The logical disk unit compares the virtual track search command argument (CCHHR = X0001000001) with the data in logical sector 00-0-7. If they match, the logical disk unit 209 sends the search argument to DCU 106. It then sends a command complete signal to DCU 106.

The return of the command complete signal to DCU 106 at this time advises DCU 106 that the disk units 211 are in their rotational position for sector 7 containing the count field of virtual record 1 as shown on FIG. 11. The DCU 106 may then transmit a command to the logical disk unit to cause the logical disk unit to either write the data field of record 1 or to read the data field of record 1 from sector 9. The logical device 209 waits for sector 9 to read or write the data.

If the match fails, the logical disk unit searches every other logical sector looking for a match on the search command argument. If index point of the logical disk is passed twice, the logical disk unit signals record not found in the same fashion as does the emulated virtual disk unit.

The logical disk unit uses the remainder of logical sectors 00-0-7, 00-0-8, and their associated gaps to simulate the channel/disk control unit turnaround time required by a virtual track G2 gap.

On a device read operation, DCU 106 sends the first read command to logical disk unit 209 to cause it to read the next virtual track count and data fields of virtual record 1 of logical sectors 7 and 9 of FIG. 11. The data field in logical sector 00-0-9 for virtual track record 1 is read into logical sector buffer 407 at this time.

Since the transfer rate for the data from the physical devices 211 to the buffer 407 is faster than the transfer rate from the logical disk unit logical sector buffer 407 to the DCU 106, the logical disk unit does not initiate the transfer of the data to DCU 106 until sufficient information has been read from the physical disk units 211 into logical sector buffer 407 to allow the data to be transferred to the channel/disk control unit at the slower rate of channel 107. When the data transfer to DCU 106 for record R1 is complete, the logical disk unit 209 signals command complete to DCU 106.

The next sector after sector 9 on FIG. 11, logical sector 00-0-A, and its associated gaps simulate the channel/disk control unit turn around time provided by the virtual track G3 gap following the record R2 data field.

DCU 106 sends the next read data command to logical disk unit 209. Since the virtual cylinders are interleaved on the logical cylinder, logical disk sector 00-0-B contains the count field of virtual record R2 which is the next record in the same virtual track. Since rotational orientation has already been established, the count field for record R2 is read by the logical disk unit 209, but the count field is not transferred by to DCU 106 since the host does not ask for the count field on a read command. The remainder of logical sectors 00-0-B, 00-0-C, and their associated gaps simulate the required virtual track G2 gap following the record R2 count field. The logical disk unit is then positioned at logical sector 00-0-D. Since the command received from DCU 106 was a read data command, and since the count field for virtual record 2 from logical sector 00-0-B indicates that a key field is present, logical sector 00-0-D is ignored since it contains the bytes of the key field. The remainder of logical sectors 00-0-D, 00-0-E, and their associated gaps simulate the required virtual track G2 gap. The logical disk unit is now positioned at logical sector 00-0-F. The data field of record R2 is read from sector F. This information is sent to DCU 106 in the same manner as for record 1. The logical unit then sends a command complete signal to DCU 106 to end the device read operation.

Description of Virtual Track Write

A virtual track write is executed in an analogous fashion to a virtual track read.

A typical channel program to search a virtual track for the count field record 1 of virtual cylinder 1, virtual track 0, and then write the data fields for records 1 and 2 consists of the following channel command words:
 Seek CCHH = X00010000
 Set sector S = X05
 Search ID CCHHR X0001000001 (x = hexadecimal)
 TIC *−8
 Write data
 Write data
 Read sector The logical disk unit processes the seek, set sector, and search commands in the same fashion as described for a virtual track read operation. This is done by translating the virtual track seek address to the equivalent logical track seek address by simultaneously positioning the heads of all physical devices 211, by reading the ID fields from physical device 0, by translating the virtual track rotational position sector number to the equivalent virtual segment number on physical device 0, by scanning for the logical sector that contains the virtual segment number, and by searching for the logical sector (sector 7) containing the count field of record R1 on virtual track 1. A command complete signal is then returned to DCU 106 when sector 7 is found.

The logical disk unit 209 uses the remainder of physical sectors 00-0-7 and 00-08 to simulate the channel/disk control unit turnaround time required by a virtual track G2 gap. The data for virtual record R1 is written into logical sector 9. Since the transfer rate for the data to the physical devices 211 from the logical disk unit 209 is faster than the data rate from DCU 106 to the logical sector buffer 407, physical sectors 00-07, 00-0-8, and their associated gaps includes sufficient time to enter sufficient information into the logical sector buffer 407 to allow the data to be transferred to the physical devices 211 at a faster rate than the slower transfer rate from DCU 106 to the logical unit 209. When the write operation for record R1 is complete in sector 9, the logical disk unit 209 returns a command complete signal to DCU 106. The DCU then sends the next write command to the logical disk unit 209 to write the next virtual track record data field (record R2). The logical unit 209 then returns a command complete signal to DCU 106 when the writing of record R2 is completed in sector E.

In each of the above identified write data operations, DCU 106 not only transmits the write data command to the logical unit, but follows the command with the data that is to be written at this time by the logical unit 209. This data is entered into the logical sector buffer 407 from DCU 106, temporarily stored in logical sector buffer 407 and then read out of logical sector buffer 407 and applied to the physical disk units 211 to cause them to write the data into the data field of the specified logical sector.

The logical disk unit returns a command complete signal to DCU 106 after it completes the writing of the data received with the write data command. After the second write data command and its associated data is received and entered into the physical disk units 211 and a command complete signal is returned to DCU 106, DCU 106 sends a read sector command to the logical disk unit 209. This causes the logical disk unit to return the virtual rotational position sector number (sector 8) containing the count field of record 2. This information is transmitted to and stored by the mainframe which associates it with virtual record R2 so that the next time the mainframe wishes to access virtual record R2 in logical disk unit 209, it can do so directly by specifying to logical disk unit 209 the rotational position sector number of the virtual track in which record 2 is stored.

The TIC *−8 command preceding the first write data command, a loopback operation that functions in the same manner as described for the same command in connection with the read operation.

Media defects are handled by LDU 209 without operating system intervention. Whenever a defective sector is encountered, it is flagged as defective and all sector addresses are shifted down the track, the address of the defective sector is assigned to the next sector on the track and so on until all spare sector on the track are assigned. When all of the spare sectors on a track are used the track is flagged as defective and an alternate track assigned.

It has been mentioned that the logical unit of the invention receives commands from the mainframe in the well known CKD format for the variable length records. Following is a list of these commands.

|  | Command Code | |
|---|---|---|
| Command | Hexa-decimal | Binary |
| CONTROL | | |
| No operation (No-Op) | '03' | 0000 0001 |
| Recalibrate | '13' | 0001 0011 |
| Seek | '07' | 0000 0111 |
| Seek Cylinder | '08' | 0000 1011 |
| Seek Head | '1B' | 0001 1011 |
| Space Count | 'OF' | 0000 1111 |

| Command | Command Code | |
|---|---|---|
| | Hexa-decimal | Binary |
| Set File Mask | '1F' | 0001 1111 |
| Set Factor | '23' | 0010 0011 |
| Restore | '17' | 0001 0111 |
| Suspend Multipath Reconnection | '5B' | 0101 1011 |
| Set Path Group Identifier (ID) | 'AF' | 1010 1111 |
| Define Extent | '63' | 0110 0011 |
| Locate Record | '47' | 0100 0111 |
| SEARCH | | |
| Home Address Equal | '39' | 1011 1001 |
| Identifier (ID) Equal | '31' | 0011 0001 |
| Identifier (ID) High | '51' | 0101 0001 |
| Identifier (ID) Equal or High | '71' | 0111 0001 |
| Key Equal | '29' | 0010 1001 |
| Key High | '49' | 0100 1001 |
| Key Equal or High | '69' | 0110 1001 |
| READ | | |
| Home Address | '1A' | 0001 1010 |
| Read Special Home Address | '0A' | 0000 1010 |
| Count | '12' | 0001 0010 |
| Record Zero (RO) | '16' | 0001 0110 |
| Data | '06' | 0000 0110 |
| Key and Data | '0E' | 0000 1110 |
| Count, Key, and Data (CKD) | '1E' | 0001 1110 |
| Multiple Count, Key and Data | '5E' | 0101 1110 |
| Initial Program Load (IPL) | '02' | 0000 0010 |
| Sector | '22' | 0010 0010 |
| SENSE | | |
| Sense Identification (ID) | 'E4' | 1110 0100 |
| Sense Path Group Identifier (ID) | '34' | 0011 0100 |
| Sense | '04' | 0000 0100 |
| Read and Reset Buffered Log | 'A4' | 1010 0100 |
| Device Reserve | 'B4' | 1011 0100 |
| Unconditional Reserve | '14' | 0001 0100 |
| Device Release | '94' | 1001 0100 |
| Read Device Characteristics | '64' | 0110 0100 |
| WRITE | | |
| Home Address | '19' | 0001 1001 |
| Write Special Home Address | '09' | 0000 1001 |
| Record Zero (RO) | '15' | 0001 0101 |
| Erase | '11' | 0001 0001 |
| Count, Key, and Data (CKD) | '1D' | 0001 1101 |
| Special Count, Key and Data | '01' | 0000 0001 |
| Data | '05' | 0000 0101 |
| Key and Data | '0D' | 0000 1101 |
| Update Data | '85' | 1000 0101 |
| Update Key and Data | '8D' | 1000 1101 |
| CDK Next Track | '9D' | 1001 1101 |
| DIAGNOSTIC | | |
| Diagnostic Sense | '44' | 0100 0100 |
| Diagnostic Load | '53' | 0101 0011 |
| Diagnostic Write | '73' | 0111 0011 |
| Diagnostic Control | 'F3' | 1111 0011 |
| Diagnostic Sense/Read | 'C4' | 1100 0100 |

The microprocessor 301 in the logical unit receives the above commands in the CKD format from the mainframe 100 and converts the received commands into the fixed length sector commands listed below. The fixed length sector commands are applied by microprocessor 301 to the physical devices 211 to control their operation. The below listed commands are an industry standard and are described in detail in ANSI documents X319.2/87-105 and 319.3/87-005 Revision 2.A 4/29/88 pertaining to Enhanced Small Device Interface.

| Magnetic Disk Commands | |
|---|---|
| CMD Fctn Bits 15-12 | CMD Function Definition |
| 0000 | Seek |
| 0001 | Recalibrate |
| 0010 | Request Status |
| 0011 | Request Configuration |
| 0100 | Select Mead Group |
| 0101 | Control |
| 0110 | Data Strobe Offset |
| 0111 | Track Offset |
| 1000 | Initiate Diagnostics |
| 1001 | Set Bytes per Sector |
| 1010 | Set High Order Value |
| 1011 | Reserved |
| 1100 | Reserved |
| 1101 | Reserved |
| 1110 | Set Configuration |
| 1111 | Reserved for Linking |

Signal Lines—Pin Assignments

Pin assignments for the control cable are shown. The direction→is Output to the drive and ←is Input to the controller.

| Control Cable (J1/P1) Pin Assignments: | | |
|---|---|---|
| Disk Signals | Signal Pin | Ground Pin |
| Cable is Flat Ribbon (3 meters maximum) | | |
| → Head Select 2(3) | 2 | 1 |
| → Head Select 2(2) | 4 | 3 |
| → Write Gate | 6 | 5 |
| ← Config/Status Data | 8 | 7 |
| ← Transfer ACK | 10 | 9 |
| ← Attention | 12 | 11 |
| → Head Select 2(0) | 14 | 13 |
| ← Sector/AM Found | 16 | 15 |
| → Head Select 2(1) | 18 | 17 |
| ← Index | 20 | 19 |
| ← Ready | 22 | 21 |
| → Transfer Req | 24 | 23 |
| → Drive Select 2(0) | 26 | 25 |
| → Drive Select 2(1) | 28 | 27 |
| → Drive Select 2(2) | 30 | 29 |
| → Read Gate | 32 | 31 |
| → Command Data | 34 | 33 |

| Data Cable (J2/P2) Pin Assignments: | | |
|---|---|---|
| Disk Signals | Signal Pin | Ground Pin |
| Cable is Flat Ribbon (3 meters maximum) | | |
| ← Drive Selected | 1 | |
| ← Sector/AM Found | 2 | |
| ← Command Complete | 3 | |
| → Address Mark Enable | 4 | |
| Ground | 5 | |
| → +/− Write Clock | 7/8 | 6 |
| Ground | 9 | |
| ← +/− Read Reference Clock | 10/11 | 12 |
| → +/− Write Data | 13/14 | 15/16 |
| ← +/− Read Data | 17/18 | 19 |
| ← Index | 20 | |

Summary of Advantages of the Present Invention

The present invention permits a virtual record on a first virtual recording surface served by a first virtual head and cylinder to be read and then a second virtual record served by a different virtual head and track but on the same or on a different cylinder to be immediately read by means of head switching without waiting for a complete revolution of the virtual disk to pass. Vendor systems can execute this operation, and since the present invention emulates the vendor system directly, the physical devices 211 of the present invention also execute this operation. The prior art cannot perform this function in connection with the recording of a virtual record in the CKD format having variable length data fields. The prior art cannot perform this function of reading or writing successive virtual records since the prior art takes longer to write a virtual record than does the virtual machine it emulates. One reason the prior art has this deficiency is that it has to read the entire virtual track into a buffer and then write the contents of the buffer into the logical device. This takes longer than does the physical device being emulated and therefore extra revolutions are wasted by the devices of the prior art so that successive and adjacent virtual records on different heads within the same cylinder cannot be read immediately without lost revolutions of the logical physical devices. Also, some of the prior art, such as Ouchi, requires extra program commands and operations to be performed after the last byte of a virtual record is written. For example, Ouchi requires the recording of a parity byte after the last segment of the virtual record is recorded. Contrariwise, the system of the present invention records each data byte representing a virtual record as it is received and generates and records the parity byte concurrently with the recording of the last byte of received data. Therefore, the present invention can emulate the physical characteristics of the emulated device by recording successive virtual records regardless of whether the records are on the same virtual track or on different tracks of the same cylinder.

The prior art ignores the problem presented by variable length data fields and in synchronizing the variable length data fields to the channel transfer rate. The priorly mentioned Hartness patent addresses the problem of matching channel rates to the data rates of a plurality of provided physical devices. However, Hartness does so only with regard to the serving of records of fixed length. Contrariwise, the present invention serves variable length records in the IBM CKD format and at the same time synchronizes the data channel transfer rate to the data transfer rate of the provided physical devices. For example, if the channel transfer rate is 6 megabytes per second, then 4 physical devices (excluding parity) can be provided each having a data transfer rate of 12 megabytes per second. Considering that the devices are active only in alternate, rather than in every logical sector, the 4 devices together provide a data transfer rate over the channel of 6 megabytes per second. The present invention has a throughput equivalent to the vendor virtual device.

The present invention does not require correspondence between the emulated virtual sector and the logical fixed physical sector. This is obvious from FIG. 11 where the data from a given virtual record is spread all over many different logical sectors. It does this without requiring special tables or operating system modifications or a special controller. This is a significant advantage. For example, the prior art requires many modifications to the operating system of the mainframe or the CPU in order to accommodate virtual records in the CKD format. The reason for this is the prior art is designed to serve only records in the IBM fixed length format. This format has a very limited subset of instructions and it cannot perform the functions described for the IBM CKD format in this application and which functions can be performed by the system of the present invention. This is an important feature insofar as system users are concerned since if a logical disk is provided as an alternative for a vendor specific customized disk unit, then it is most desirable that the provided logical disk device unit be plug compatible in every respect so that users may use the logical device without modifying software or the operation of the mainframe CPU. It has been shown in connection with the present application how the system of the present invention receives and executes commands in the IBM CKD format and, in so doing, how it translates the received information and causes the physical devices 211, which may be hard disks of the type used in personal computers and which are intended by their manufacturer to accommodate only commands in the fixed length format. The logical sector generator and microprocessor 301 of the present invention acts as an interface between the physical devices 211 and the received virtual records in the CKD format to translate between the mainframe and disk units 211 so that variable length records may be recorded on or written from the devices 211 in the same manner as it is done in the virtual equipment being emulated by the present invention. The present invention therefore, is plug compatible and duplicates the physical characteristics of the virtual devices in every respect insofar as concerns the system user. The prior art require tables, directories, record segmentation, etc. for sector conversions. That's not required in the present invention because all of the algorithms needed to calculate the positioning information is done on the fly in response to information received from over the channel.

The system comprising the present invention provides improved performance that equals or exceeds the physical characteristics of the devices being emulated. For example, the data transfer rate applied over the channel 107 may exceed that of the currently available vendor devices. For example, the data rate of channel 107 as embodied in the currently available vendor equipment is 6 megabytes per second. Yet, the highest data rate available from the disk unit that is provided by the vendor is 4½ megabytes per second. This means that the channel 107 is underutilized by 1½ megabytes per second. Contrariwise, in accordance with the present invention, a sufficient number of physical devices 211 may be provided so as to apply the full 6 megabyte capacity to channel 107. This would require 4 devices 211, excluding parity, with each device having a basic data rate of 3 megabytes per second. The 4 devices together would therefore have a data rate of 12 megabytes per second but in considering the fact that the devices are active only in alternate logical sectors, the effective data rate is divided by 2 to provide a resultant data rate to channel 107 of 6 megabytes per second. In other words, the present invention permits using currently available technology including inexpensive commodity drives to increase the data rate on the channel over that which can currently be provided by expensive vendor specific custom drives.

Also, since the physical devices of the present invention store 2 virtual tracks worth of information on a single track of the logical device, fewer tracks and cylinders are used. This results in a reduction of the seek time required when a seek command is received from the mainframe. Vendor systems require equipment that writes information on separate cylinders whereas the present invention alternates on each one of its cylinders the data or information in separate logical sectors for two virtual cylinders and requires only half as many cylinders to emulate the same virtual capacity. This has the advantage that seek time for the heads to move between the various cylinders is quicker. Essentially, the seek time is cut in half.

It is to be expressly understood that the claimed invention is not to be limited to the description of the preferred embodiment but encompasses other modifications and alterations within the scope and spirit of the inventive concept. For example each physical device 211 could store one or more bits, rather than a byte, of a word from a virtual record. The number of physical devices 211 required to store data would be determined by the number of bits stored by each device and the number of bits in the virtual word.

I claim:

1. A method of operating a logical data storage system connected to a computer via a data channel for an exchange of data between said computer and said logical data storage system, said logical data storage system comprising a parity storage unit and n sequentially arranged data storage units comprising a logical storage unit, said method comprising the steps of;
  applying segments of virtual data records of different virtual tracks from said computer via said channel to said logical data storage system,
  sequentially distributing applied segments of a virtual record to said n data storage units so that each applied segment is distributed to a single unit and so that all of said n data storage units together receive segments comprising the entirety of said virtual record,
  generating a parity segment representing the parity of each group of n applied segments in response to the distribution of said each group of n segments of said virtual record to said n data storage units,
  distributing each generated parity segment to said parity storage unit, and
  interleaving distributed segments of different virtual tracks onto a single logical track of said logical unit by writing each distributed segment into the storage unit to which said segment is distributed so that segments of virtual records of a first virtual track are written into alternate and non adjacent logical sectors of a single logical track and so that the logical sectors of said single logical track not containing segments of said first virtual track are written to contain segments of another virtual track.

2. The method of claim 1 in which each of said virtual records comprises a plurality of fields separated by gaps and wherein each of said logical sectors serves the dual function of storing segments of a virtual record of one virtual track while simulating a gap of a virtual record of another virtual track.

3. The method of claim 2 wherein each of said virtual tracks are on the same virtual cylinder.

4. The method of claim 3 wherein said logical unit emulates the physical characteristics of a virtual device containing said virtual records.

5. A method of operating a logical data storage system connected to a computer via a data channel for the exchange of data between said computer and said logical data storage system, said logical data storage system comprising n sequentially arranged data storage units forming a logical storage unit and a parity storage unit, said method comprising the steps of;
  operating said logical data storage system for receiving bytes of virtual data records of at least two different virtual tracks from said computer via said channel, each of said records having a plurality of fields separated by gaps,
  sequentially distributing received bytes of each virtual record to said sequentially arranged n data storage units so that each received byte is distributed to a single unit and so that all of said n data storage units together receive bytes comprising the entirety of said each virtual record,
  generating a parity byte representing the parity of each group of n received bytes of a virtual record in response to the distribution of said each group of n bytes to said n data storage units,
  distributing each generated parity byte to said parity unit concurrently with the distribution of the last byte of the group of n bytes from which said parity byte is generated, and
  interleaving received bytes of different virtual tracks onto a single logical track of said logical data storage unit by writing each distributed byte into the unit to which said byte is distributed so that the bytes of virtual records of a first virtual track are written into a plurality of alternate and nonadjacent logical sectors of a single logical track comprising a corresponding track of each of said n units, said writing being effected in such a manner so that adjacent sectors of said logical track contain bytes of virtual records from different virtual tracks and so that each logical sector serves the dual function of storing data bytes of a virtual record of one virtual track and for simulating a gap for another virtual record of another virtual track.

6. A method of operating a logical data storage system adapted to emulate a virtual data storage system, said logical data storage system comprising a logical disk storage unit connected to a computer via a data channel for the exchange of data between said computer and said logical data storage system, said method comprising the steps of;
  operating said logical system for receiving bytes of virtual records of different virtual tracks from said computer via said channel,
  applying received bytes of each virtual record to said logical disk unit,
  interleaving received bytes of different virtual tracks onto a single logical track of said logical unit by writing received bytes representing a first virtual record of a first virtual track into a plurality of alternate and nonadjacent logical sectors of a single logical track of said logical disk unit, and
  writing received bytes representing another virtual record of another virtual track into the logical sectors of said logical track that do not contain bytes of said first logical record and that are intermediate and adjacent the logical sectors of said logical track that do contain bytes of said first virtual record,
  said writing being effected in said interleaved manner so that adjacent sectors of said logical track contain bytes of different virtual records from said different virtual tracks.

7. The method of claim 6 wherein said different virtual tracks are on the same virtual cylinder of a virtual disk unit containing said virtual tracks.

8. The method of claim 6 wherein;

said logical disk unit comprises n different data storage disk units spindle synchronized so as to maintain rotational synchronization, said step of applying comprises the step of sequentially distributing the received bytes of each virtual record to said n units so that each received byte is distributed to a single unit and so that all of said n units together receive the bytes comprising the entirety of each received virtual record, and said step of writing comprises the step of writing each distributed byte into the unit to which said byte is distributed.

9. The method of claim 8 in which said method further comprises;

the step of responding to each distribution of a byte to each of said n units for generating a parity byte for said bytes received by each of said n units, and writing said parity byte into a parity unit.

10. The method of claim 6 wherein each of said virtual records comprises a plurality of fields adjacent to each other on the virtual track containing said each record with each of said fields of a virtual record being separated from an adjacent field by a gap characterized by a plurality of byte times, and wherein each of said virtual records is written into alternate sectors of said logical track so that the byte times comprising said gaps for a first one of said virtual records of a first virtual track are simulated by logical sectors of said logical track that do not contain bytes of the virtual track containing said first virtual record but that do contain bytes of another virtual record of another virtual track.

11. The method of claim 10 wherein at least one field of each virtual record comprises a data field whose length is dependant upon the quantity of bytes in said data field so that the length of the data field of a first virtual record can differ from the length of the data field of another virtual record, and wherein said method further comprises the step of;

writing bytes of the data field of a virtual record into said logical sectors of a logical record with the number of logical sectors required for the writing of said data bytes being determined by the quantity of bytes in said virtual data field.

12. A method of operating a logical data storage system adapted to emulate a virtual data storage system, said logical data storage system comprising a logical disk storage unit connected to a computer via a data channel for the exchange of data between said computer and said logical data storage system, said method comprising the steps of:

operating said logical system for receiving bytes of virtual records of different virtual tracks from said computer via said channel, applying received bytes of each virtual record to said logical disk unit, interleaving received bytes of different virtual tracks onto a single logical track of said logical unit by writing received bytes representing a first virtual record of a first virtual track into a plurality of alternate and nonadjacent logical sectors of a single logical track of said logical disk unit, and writing received bytes representing another virtual record of another virtual track into the logical sectors of said logical track that do not contain bytes of said first logical record and that are intermediate and adjacent the logical sectors of said logical track that do contain bytes of said first virtual record, said writing being effected in such a manner so that adjacent sectors of said logical track contain bytes of different virtual records from said different virtual tracks;

said virtual records being recorded on said logical track in such a manner that;

a first sector on said logical track contains information for a first gap of a first virtual record of a first virtual track and a first gap of a second virtual record of a second virtual track, a second sector adjacent to said first sector on said logical track contains home address information of both said first and second virtual records, a third sector adjacent to said second sector on said logical track contains a count field of said first virtual record of said first virtual track, a fourth sector adjacent to said third sector on said logical track contains a count field of said second virtual record of said second virtual track, subsequent sectors of said logical track contain other fields of virtual records including said first and second virtual records of said first and second virtual tracks so that said other fields of said first and second virtual records are interleaved on said logical track with adjacent fields of said logical track containing bytes of virtual records of different virtual tracks.

13. A method of operating a logical data storage system adapted to emulate a virtual data storage system, said logical data storage system comprising a logical disk unit connected to a computer via a data channel for the exchange of data between said computer and said logical data storage system, said method comprising the steps of;

operating said logical data storage system for receiving segments of virtual records of different virtual tracks from said computer via said channel with said records having a plurality of fields separated by gaps, applying received segments of each virtual record to said logical disk unit, and interleaving received segments of different virtual tracks onto a single logical track of said logical disk unit by writing said received segments representing said virtual records into different logical sectors of a single logical track of said logical disk unit so that each logical sector serves the dual function of storing segments of a virtual record of one of said virtual tracks as well of simulating a gap time for a virtual record of another virtual track.

14. The method of claim 13 wherein said writing is effected in such a manner that received segments representing a first virtual record of a first virtual track are written into a plurality of alternate and nonadjacent logical sectors of said single logical track of said logical disk unit and so that segments representing another virtual record of a different virtual track are written into the logical sectors of said logical track not containing segments of said first virtual record, said writing being further effected in such a manner so that adjacent sectors of said logical track contain segments of different virtual records from said different virtual tracks.

15. The method of claim 14 wherein said different virtual tracks are on the same virtual cylinder of a virtual disk unit containing said virtual tracks.

16. The method of claim 14 wherein;
said logical disk unit comprises n different data storage disk units spindle synchronized so as to maintain rotational synchronization,
said step of applying comprises the step of sequentially distributing received segments of each virtual record to said n units so that each received segment is distributed to a single unit and so that all of said n units together receive the segments comprising the entirety of each received virtual record, and
said step of writing comprises the step of writing each received segment into the unit to which said segment is distributed.

17. The method of claim 13 wherein each of said virtual records comprises a plurality of fields adjacent to each other on the virtual track containing said each record with each of said fields being separated from an adjacent field by a gap characterized by a plurality of segment times, and
wherein each of said virtual records is written into alternate logical sectors of said logical track so that segment times representing said gaps for a first one of said virtual records are simulated by sectors of said logical track that do not contain segments of said first virtual record.

18. The method of claim 13 wherein at least one field of each virtual record comprises a data field whose length is dependant upon the quantity of data segments in said field so that the length of the data field of a first virtual record can differ from the length of the data field another virtual record, and wherein said method further comprises the step of;
writing segments of a data field of a virtual record into sectors of a logical record with the number of logical sectors required for said writing of said data segments being determined by the quantity of segments in said virtual data field.

19. A method of operating a logical data storage system adapted to emulate a virtual data storage system, said logical data storage system comprising a logical disk unit connected to a computer via a data channel for the exchange of data between said computer and said logical data storage system, said method comprising the steps of;
operating said logical system for receiving bytes of virtual records of different virtual tracks from said computer via said channel with said records having a plurality of fields separated by gaps,
applying received bytes of each virtual record to said logical disk unit, and
interleaving received bytes of different virtual tracks onto a single logical track of said logical unit by writing said received bytes representing said virtual records into different logical sectors of a single logical track of said logical disk unit so that each logical sector serves the dual function of storing bytes of a virtual record of one of said virtual tracks as well of simulating a gap time for a virtual record of another virtual track;
said virtual records being recorded on said logical track in such a manner that;

a first sector on said logical track contains information for a first gap of a first virtual record of a first virtual track and a first gap of a second virtual record of a second virtual track,
a second sector adjacent to said first sector on said logical track contains home address information of both said first and second virtual records,
a third sector adjacent to said second sector on said logical track contains a field of said first virtual record of said first virtual track,
a fourth sector adjacent to said third sector on said logical track contains a field of said second virtual record of said second virtual track,
alternate subsequent and nonadjacent sectors of said logical track contain other fields of virtual records including said first and second virtual records of said first and second virtual tracks so that the fields of said first and second virtual records are interleaved on said logical track with adjacent fields of said logical track containing bytes of virtual records of different virtual tracks.

20. A method of operating a logical data storage system adapted to emulate a virtual data storage system, said logical data storage system comprising a logical disk storage unit connected to a computer via a data channel for the exchange of data between said computer and said logical data storage system, said method comprising the steps of;
assigning pairs of virtual tracks of virtual cylinders of said virtual system to a single logical track of a logical cylinder of said logical disk unit for the storage by said logical unit of bytes of virtual records on said virtual tracks, each of said pairs of virtual tracks being on the same virtual cylinder and each pair of virtual tracks being assigned to a different one of said logical tracks,
applying commands from said computer to said logical unit specifying the virtual cylinder and head and record number of a first virtual record for which updated data bytes are to be written into an assigned logical track of said logical disk unit,
operating said logical disk unit in response to the receipt of said commands specifying said virtual cylinder and head and record number for said first virtual record for which said updated data bytes are to be written to identify the area of said logical track containing said first virtual record,
sending a command from logical disk unit to said computer when said logical disk unit is in an operational position corresponding to said first virtual record on said logical track,
applying updated bytes of said first virtual record from said computer via said channel to said logical disk unit,
writing said applied updated bytes of said first virtual record into the location of said identified logical track containing said first virtual record,
said writing being effected in an interleaved manner so that said updated bytes of said first virtual record are written into a plurality of alternate and nonadjacent logical sectors of said assigned logical track of said logical disk unit, and
writing applied bytes representing another virtual record of the other virtual track, of the same pair of virtual tracks that contains said first virtual record into the logical sectors of said logical track that do not contain bytes of said first virtual record and that are intermediate and adjacent the logical sectors of said logical track that do contain bytes of said first virtual record, said writing being effected in said interleaved manner so that adjacent sectors of said logical track contain bytes of different virtual records from said pair of virtual tracks of a single virtual cylinder.

21. The method of claim 20 wherein said bytes of said virtual records include information specifying the length of data fields of said virtual records and wherein said bytes of each virtual record are written into a plurality of logical sectors equal in number to that required to store all bytes comprising each such virtual record.

22. The method of claim 21 wherein said logical disk unit comprises a controller and a logical physical disk unit and wherein said controller responds to the reception by said logical unit of said bytes from said computer and applies commands in a fixed length sector format to said logical physical disk unit to control the logical sector of said logical physical disk unit into which each byte of a virtual record received from said computer is to be written.

23. The method of claim 22 wherein said commands applied by said computer to said logical disk unit to control an operation of said logical unit are identical to commands sent by said computer to a virtual system to control an operation corresponding to that performed by said logical unit in response to the reception of said identical commands from said computer.

24. A method of operating a logical data storage system adapted to emulate the physical and operational characteristics of a large capacity vendor unique virtual data storage disk drive system capable of supporting records having variable length data fields, said logical data storage system comprising:

a plurality of n sequentially arranged industry standard commodity disk drives arranged to form a logical disk storage unit connected to a computer via a data channel for the exchange of data between said computer and said logical data storage system, said method comprising the steps of:

operating said computer to apply to said logical system standard commands of said large capacity vendor unique virtual disk drive, and operating said logical system in response to a reception of said standard commands for emulating command bytes, gaps, and variable length data fields of said large capacity vendor unique virtual disk drive using only standard commands, gaps, and fixed length data fields of said sequentially arranged commodity disk drives wherein the physical size of the virtual records written to said logical disk storage unit can be of a variable length, said system being effective to interleave received bytes of different virtual tracks onto a single logical track of said logical unit.

25. The method of claim 24 wherein a correspondence does not exist between the physical size of said virtual records written to said emulated virtual disk drive and the size of the logical sectors written to the physical commodity disk drives comprising said logical storage unit.

26. The method of claim 24 wherein key and or data fields can be written by said logical storage unit for a virtual record normally written to said emulated virtual disk drive.

27. The method of claim 24 wherein said logical storage unit includes a parity disk drive that achieves a mean time between failure for said logical unit that exceeds the mean time between failure of said emulated virtual disk drive.

28. The method of claim 24 wherein higher speed channel data transfer rates can be supported by said logical unit exclusive of a cached disk control unit and wherein data transfer rates can be executed by said system at speeds limited only by the speed capabilities of said channel.

29. The method of claim 24 wherein head switching within a cylinder of said logical unit is performed without performance loss or lost revolutions of a recording medium comprising said logical unit.

30. The method of claim 24 wherein updates of virtual records stored on said logical unit are executed directly on said commodity disk drives comprising said logical unit during write operations to said logical unit.

31. The method of claim 24 wherein all read and write operations by said logical unit are executed with said commodity disk drives comprising said logical unit synchronized to said channel.

32. The method of claim 24 wherein multiple virtual tracks of said virtual system are contained on one logical track of said logical unit.

33. The method of claim 24 wherein occurrences of single cylinder seek operations within said logical unit are reduced by the number of multiple virtual tracks contained on one logical track of said logical unit as compared to the number of cylinder seek operations required by said virtual system.

34. The method of claim 24 wherein the actual number of physical cylinders traversed by said logical unit as compared to said virtual system in response to the reception of a command by said logical unit from said computer is determined by dividing the number of virtual cylinders of said virtual disk drive by the number of virtual tracks contained on one logical track of said logical unit.

35. A method of operating a logical data storage system adapted to emulate the physical and operational characteristics of a large capacity vendor unique virtual data storage disk drive system capable of supporting records having variable length data fields, said logical data storage system comprising;

a plurality of n sequentially arranged industry standard commodity disk drives arranged to form a logical disk storage unit connected to a computer via a data channel for the exchange of data between said computer and said logical data storage system, said method comprising the steps of;

operating said computer to apply to said logical system standard commands of said large capacity vendor unique virtual disk drive, operating said logical system in response to a reception of said standard commands for emulating command bytes, gaps, and variable length data fields of said large capacity vendor unique virtual disk drive using only standard commands, gaps, and fixed length data fields of said sequentially arranged commodity disk drives wherein the physical size of the virtual records written to said logical storage unit can be of a variable length, assigning pairs of virtual tracks of virtual cylinders of said virtual system to a single logical track of a logical cylinder of said logical unit for the storage by said logical unit of the bytes of virtual records on said virtual tracks, each pair of virtual tracks being assigned to a different one of said logical tracks, applying commands from said computer to said logical unit specifying the virtual cylinder and head and record number of a first virtual record for which data bytes are to be written into an assigned logical track of said logical unit, operating said logical unit in response to the receipt of said commands specifying said virtual cylinder and head and record number for said first virtual record for which said data bytes are to be written to identify the area of said logical track where said bytes of said first virtual record are to be written, sending a command from said logical disk unit to said computer when said logical unit is in an operational position corresponding to said first virtual record on said logical track, applying said bytes to be written of said first virtual record from said computer via said channel to said logical disk unit, writing said applied bytes of said first virtual record into the location of said identified logical track where said bytes of said first virtual record are to be written, said writing being effected an interleaved manner that said bytes of said first virtual record are written into a plurality of alternate and nonadjacent logical sectors of said assigned logical track of said logical disk unit, and writing applied bytes representing another virtual record of the other virtual track, of the same pair of virtual tracks that contains said first virtual record, into the logical sectors of said logical track that do not contain bytes of said first virtual record and that are intermediate and adjacent the logical sectors of said logical track that do contain bytes of said first virtual record, said writing being effected in said interleaved manner so that adjacent sectors of said logical track contain bytes of different virtual records from said pair of virtual tracks of a single virtual cylinder.

36. In a logical data storage system connected to a computer via a data channel for an exchange of data between said computer and said logical storage system, said storage system comprising;

a parity storage unit and n sequentially arranged data storage units comprising a logical data storage unit, means for receiving segments of virtual data records of different virtual tracks from said computer via said channel, means for sequentially distributing received segments of a virtual record to said n data storage units so that each received segment is distributed to a single data storage unit and so that all of said n data storage units together receive segments comprising the entirety of said record, means for generating a parity segment representing the parity of each group of n received segments in response to the distribution of said each group of n segments of said virtual record to said n units, means for distributing each generated parity segment to said parity unit, and means for interleaving received segments of different virtual tracks onto a single logical track of said logical unit by writing each distributed segment into the unit to which said segment is distributed so that the segments of virtual records of a first virtual track are written into alternate and non adjacent logical sectors of a single logical track and so that the logical sectors of said single logical track not containing bytes of said first virtual track are written to contain bytes of another virtual track.

37. The system of claim 36 in which each of said virtual records comprises a plurality of fields separated by gaps and wherein each of said logical sectors serves the dual function of storing segments of a virtual record of one virtual track while simulating a gap of a virtual record of another virtual track.

38. The system of claim 37 wherein each of said virtual tracks are on the same virtual cylinder.

39. The system of claim 38 wherein said logical device emulates the physical characteristics of a virtual device containing said virtual records.

40. A logical data storage system connected to a computer via a data channel for the exchange of data between said computer and said logical data storage system, said logical data storage system comprising;

n sequentially arranged data storage units forming a logical data storage unit and a parity storage unit, means for receiving bytes of virtual data records of at least two different virtual tracks from said computer via said channel, each of said records having a plurality of fields separated by gaps, means for sequentially distributing received bytes of each virtual record to said sequentially arranged n data storage units so that each received byte is distributed to a single data storage unit and so that all of said n data storage units together receive bytes comprising the entirety of said each virtual record, means for generating a parity byte representing the parity of each group of n received bytes of a virtual record in response to the distribution of said each group of n bytes to said n data storage units, means for distributing each generated parity byte to said parity unit concurrently with the distribution of the last byte of the group of n bytes from which said parity byte is generated, and means for interleaving received bytes of different virtual tracks onto a single logical track of said logical data storage unit by writing each distributed byte into the data storage unit to which said byte is distributed so that the bytes of virtual records of a first virtual track are written into a plurality of alternate and nonadjacent logical sectors of a single logical track comprising a corresponding track of each of said n data storage units, said writing being effected in such a manner so that adjacent sectors of said logical track contain bytes of virtual records from different virtual tracks and so that each logical sector serves the dual function of storing data bytes of a virtual record of one virtual track and for simulating a gap for another virtual record of another virtual track.

41. A logical data storage system adapted to emulate a virtual data storage system, said logical storage system comprising;

a logical disk storage unit connected to a computer via a data channel for the exchange of data between said computer and said logical data storage system, means for receiving bytes of virtual records of different virtual tracks from said computer via said channel, means for applying received bytes of each virtual record to said logical disk unit, and means for interleaving received bytes of different virtual tracks onto a single logical track of said logical unit by writing received bytes representing a first virtual record of a first virtual track into a plurality of alternate and nonadjacent logical sectors of a single logical track of said logical disk unit, and means for writing received bytes representing another virtual record of another virtual track into the logical sectors of said logical track that do not contain bytes of said first logical record and that are intermediate and adjacent the logical sectors of said logical track that do contain bytes of said first virtual record, said writing being effected in said interleaved manner so that adjacent sectors of said logical track contain bytes of different virtual records from said different virtual tracks.

42. The system of claim 41 wherein said different virtual tracks are on the same virtual cylinder of a virtual disk unit containing said virtual tracks.

43. The system of claim 41 wherein;

said logical disk unit comprises n different data storage disk units spindle synchronized so as to maintain rotational synchronization, said means for applying comprises means for sequentially distributing the received bytes of each virtual record to said n units so that each received byte is distributed to a single unit and so that all of said n units together receive the bytes comprising the entirety of each received virtual record, and said means for writing comprises means for writing each distributed byte into the unit to which said byte is distributed.

44. The system of claim 43 in which said system further comprises means responsive to the distribution of a byte to each of said n units for generating a parity byte representing said bytes received by each of said n units, and means for writing said parity byte into a parity unit.

45. The system of claim 41 wherein each of said virtual records comprises a plurality of fields adjacent to each other on the virtual track containing said each record with each of said fields of a virtual record being separated from an adjacent field by a gap characterized by a plurality of byte times, and wherein each of said virtual records is written into alternate sectors of said logical track so that the byte times comprising said gaps for a first one of said virtual records of a first virtual track are simulated by logical sectors of said logical track that do not contain bytes of the virtual track containing said first virtual record but that do contain bytes of another virtual record of another virtual track.

46. The system of claim 45 wherein at least one field of each virtual record comprises a data field whose length is dependant upon the quantity of bytes in said data field so that the length of the data field of a first virtual record can differ from the length of the data field of another virtual record, and wherein said system further comprises;

means for writing bytes of the data field of a virtual record into said logical sectors of a logical record with the number of logical sectors required for the writing of said data bytes being determined by the quantity of bytes in said virtual data field.

47. A logical data storage system adapted to emulate a virtual data storage system, said logical storage system comprising;

a logical disk storage unit connected to a computer via a data channel for the exchange of data between said computer and said logical data storage system, means for receiving bytes of virtual records of different virtual tracks from said computer via said channel, means for applying received bytes of each virtual record to said logical disk unit, means for interleaving received bytes of different virtual tracks onto a single logical track of said logical unit by writing received bytes representing a first virtual record of a first virtual track into a plurality of alternate and nonadjacent logical sectors of a single logical track of said logical disk unit, and means for writing received bytes representing another virtual record of another virtual track into the logical sectors of said logical track that do not contain bytes of said first logical record and that are intermediate and adjacent the logical sectors of said logical track that do contain bytes of said first virtual record, said writing being effected in an interleaved manner so that adjacent sectors of said logical track contain bytes of different virtual records from said different virtual tracks, said virtual records being recorded on said logical track in such a manner that;

a first sector on said logical track contains information for a first gap of a first virtual record of a first virtual track and a first gap of a second virtual record of a second virtual track, a second sector adjacent to said first sector on said logical track contains home address information of both said first and second virtual records, a third sector adjacent to said second sector on said logical track contains a count field of said first virtual record of said first virtual track, a fourth sector adjacent to said third sector on said logical track contains a count field of said second virtual record of said second virtual track, subsequent sectors of said logical track contain other fields of virtual records including said first and second virtual records of said first and second virtual tracks so that said fields of said first and second virtual records are interleaved on said logical track with adjacent fields of said logical track containing bytes of virtual records of different virtual tracks.

48. A logical data storage system adapted to emulate a virtual data storage system, said logical data storage system comprising a logical disk unit connected to a computer via a data channel for the exchange of data between said computer and said logical data storage system, said logical data storage system further comprising;

means for receiving bytes of virtual records of different virtual tracks from said computer via said channel with said records having a plurality of fields separated by gaps, means for applying received bytes of each virtual record to said logical disk unit, and means or interleaving received bytes of different virtual tracks onto a single logical track of said logical disk unit by writing said received bytes representing said virtual records into different logical sectors of a single logical track of said logical disk unit so that each logical sector serves the dual function of storing bytes of a virtual record of one of said virtual tracks as well of simulating a gap time for a virtual record of another virtual track.

49. The system of claim 48 wherein said writing is effected in such a manner that received bytes representing a first virtual record of a first virtual track are written into a plurality of alternate and nonadjacent logical sectors of said single logical track of said logical disk unit and so that bytes representing another virtual record of a different virtual tack are written into the logical sectors of said logical track not containing the bytes of said first virtual record, said writing being effected in such a manner so that adjacent sectors of said logical track contain bytes of different virtual records from said different virtual tracks.

50. The system of claim 49 wherein said different virtual tracks are on the same virtual cylinder of a virtual disk unit containing said virtual track.

51. The system of claim 49 wherein;
said logical disk unit comprises n different data storage disk units spindle synchronized so as to maintain rotational synchronization,
and wherein said means for applying comprises means for sequentially distributing the received bytes of each virtual record to said n units so that each received byte is distributed to a single unit and so that all of said n units together receive the bytes comprising the entirety of each received virtual record, and
said means for writing comprises means for writing each received byte into the unit to which said byte is distributed.

52. The system of claim 48 wherein each of said virtual records comprises a plurality of fields adjacent to each other on the virtual track containing said each record with each of said fields being separated from an adjacent field by a gap characterized by a plurality of byte tines, and
wherein each of said virtual records is written into alternate logical sectors of said logical track so that byte times representing said gaps for a first one of said virtual records are simulated by sectors of said logical track that do not contain bytes of said first virtual record.

53. A logical data storage system adapted to emulate a virtual data storage system, said logical data storage system comprising a logical disk unit connected to a computer via a data channel for the exchange of data between said computer and said logical data storage system, said logical data storage system further comprising;
means for receiving bytes of virtual records of different virtual tracks from said computer via said channel with said records having a plurality of fields separated by gaps,
means for applying received bytes of each virtual record to said logical disk unit, and
means for interleaving received bytes of different virtual tracks onto a single logical track of said logical unit by writing said received bytes representing said virtual records into different logical sectors of a single logical track of said logical disk unit so that each logical sector serves the dual function of storing bytes of a virtual record of one of said virtual tracks as well of simulating a gap time for a virtual record of another virtual track,
said virtual records being recorded on said logical track in such a manner that;
a first sector on said logical track contains information for a first gap of a first virtual record of a first virtual track and a first gap of a second virtual record of a second virtual track,
a second sector adjacent to said first sector on said logical track contains home address information of both said first and second virtual records,
a third sector adjacent to said second sector on said logical track contains a field of said first virtual record of said first virtual track,
a fourth sector adjacent to said third sector on said logical track contains a field of said second virtual record of said second virtual track,
alternate subsequent and nonadjacent sectors of said logical tack contain other fields of virtual records including said first and second virtual records of said first and second virtual tracks so that the fields of said first and second virtual records are interleaved on said logical track with adjacent fields of said logical track containing bytes of virtual records of different virtual tracks.

54. The system of claim 48 wherein at least one field of each virtual record comprises a data field whose length is dependant upon the quantity of data bytes in said field so that the length of the data field of a first virtual record can differ from the length of the data field another virtual record, and wherein said system further comprises;
means for writing bytes of a data field of a virtual record into the number of sectors of a logical record with the number of logical sectors required for the writing of said data bytes being determined by the quantity of bytes in said virtual data field.

55. A logical data storage system adapted to emulate a virtual data storage system, said logical storage system comprising;
a logical disk storage unit connected to a computer via a data channel for the exchange of data between said computer and said logical data storage system,
means for assigning pairs of virtual tracks of virtual cylinders of said virtual data storage system to a single logical track of a logical cylinder of said logical unit for the storage by said logical disk unit of bytes of virtual records on said virtual tracks, each of said pairs of virtual tracks being on the same virtual cylinder and each pair of virtual tracks being assigned to a different one of said logical tracks,
means for applying commands from said computer to said logical disk unit specifying the virtual cylinder and head and record number of a first virtual record for which updated data bytes are to be written into an assigned logical track of said logical disk unit,
means for operating said logical disk unit in response to the receipt of said commands specifying said virtual cylinder and head and record number for said first virtual record for which said updated data bytes are to be written to identify the area of said logical track containing said first virtual record,
means for sending a command from logical disk unit to said computer when said logical disk unit is in an operational position corresponding to said first virtual record on said logical track,
means for applying said updated bytes of said first virtual record from said computer via said channel to said logical disk unit, means for writing said applied updated bytes of said first virtual record into the location of said identified logical track containing said first virtual record, said writing being effected in such a manner that said updated bytes of said first virtual record are written into a plurality of alternate and nonadjacent logical sectors of said assigned logical track of said logical disk unit, and means for writing applied bytes representing another virtual record of the other virtual track of the same pair of virtual tracks that contains said first virtual record, into the logical sectors of said logical track that do not contain bytes of said first virtual record and that are intermediate and adjacent the logical sectors of said logical track that do contain bytes of said first virtual record, said writing being effected in an interleaved manner so that adjacent sectors of said logical track contain bytes of different virtual records from said pair of virtual tracks of a single virtual cylinder.

56. The system of claim 55 wherein said bytes of said virtual records include information specifying the length of data fields of said virtual records and wherein said bytes of each virtual record are written into a plurality of logical sectors equal in number to that required to store all bytes comprising each such virtual record.

57. The system of claim 56 wherein said logical disk unit comprises a controller and a logical physical disk unit and wherein said logical controller responds to the reception by said logical disk unit of said bytes from said computer and applies commands in a fixed length sector format to said logical physical disk unit to control the logical sector of said logical physical disk unit into which each byte of a virtual record received from said computer is to be written.

58. The system of claim 57 wherein said commands applied by said computer to said logical disk unit to control an operation of said logical unit are identical to commands sent to said computer to a virtual system to control an operation corresponding to that performed by said logical unit in response to the reception of said identical commands from said computer.

59. A logical data storage system adapted to emulate the physical and operational characteristics of a large capacity vendor unique virtual data storage disk drive system capable of supporting records having variable length data fields, said logical data storage system comprising;

a plurality of n sequentially arranged industry standard commodity disk drives arranged to form a logical disk storage unit connected to a computer via a data channel for the exchange of data between said computer and said logical data storage system, means for operating said computer to apply to said logical system standard commands of said large capacity vendor unique virtual disk drive, and means for operating said logical system in response to a reception of said standard commands for emulating the command bytes, gaps, and variable length data fields of said large capacity vendor unique virtual disk drive using only standard commands, gaps, and fixed length data fields of said sequentially arranged commodity disk drives wherein the physical size of the virtual records written to said logical disk storage unit can be of a variable length, said system being effective to interleave received bytes of different virtual tracks onto a single logical track of said logical disk storage unit.

60. The system of claim 69 wherein a correspondence does not exist between the physical size of said virtual records written to said emulated virtual disk drive and the size of the logical sectors written to the physical commodity disk drives comprising said logical disk storage unit.

61. The system of claim 59 wherein key and or data fields can be written by said logical storage unit for a virtual record normally written to said emulated virtual disk drive.

62. The system of claim 59 wherein said logical storage unit includes a parity disk drive that achieves a mean time between failure of said logical unit that exceeds the mean time between failure of said emulated virtual disk drive.

63. The system of claim 59 wherein higher speed channel data transfer rates can be supported by said logical unit exclusive of a cached disk control unit and wherein data transfer rates can be executed by said system at speeds limited only by the speed capabilities of said channel.

64. The system of claim 59 wherein head switching within a cylinder of said logical unit is performed without performance loss or lost revolutions of a recording medium comprising said logical unit.

65. The system of claim 59 wherein updates of virtual records stored on said logical unit are executed directly on said commodity disk drives comprising said logical unit during write operations to said logical unit.

66. The system of claim 59 wherein all read and write operations by said logical unit are executed with said commodity disk drives comprising said logical unit synchronized to said channel.

67. The system of claim 59 wherein multiple virtual tracks of said virtual system are contained on one logical track of said logical unit.

68. The system of claim 59 wherein occurrences of single cylinder seek operations within said logical unit are reduced by the number of multiple virtual tracks contained on one logical track of said logical unit as compared to the number of cylinder seek operations required by said virtual system.

69. The system of claim 59 wherein the actual number of physical cylinders traversed by said logical unit as compared to said virtual system in response to the reception of a command by said logical unit from said computer is determined by dividing the number of virtual cylinders of said virtual disk drive by the number of virtual tracks contained on one logical track of said logical unit.

70. A logical data storage system adapted to emulate the physical and operational characteristics of a large capacity vendor unique virtual data storage disk drive system capable of supporting records having variable length data fields, said logical data storage system comprising;

a plurality of n sequentially arranged industry standard commodity disk drives arranged to form a logical disk storage unit connected to a computer via a data channel for the exchange of data between said computer and said logical data storage system, means for operating said computer to apply to said logical system standard commands of said large capacity vendor unique virtual disk drive, means for operating said logical system in response to a reception of said standard commands for emulating the command bytes, gaps, and variable length data fields of said large capacity vendor unique virtual disk drive using only standard commands, gaps, and fixed length data fields of said sequentially arranged commodity disk drives wherein the physical size of the virtual records written to said logical disk storage unit can be of a variable length, means for assigning pairs of virtual tracks of virtual cylinders of said virtual system to a single logical track of a logical cylinder of said logical unit for the storage by said logical unit of the bytes of virtual records on said virtual tracks, each pair of virtual tracks being assigned to a different one of said logical tracks, means for applying commands from said computer to said logical unit specifying the virtual cylinder and head and record number of a first virtual record for which data bytes are to be written into an assigned logical track of said logical unit, means for operating said logical unit in response to the receipt of said commands specifying said virtual cylinder and head and record number for said first virtual record for which said data bytes are to be written to identify the area of said logical track where said bytes of said first virtual record are to be written, means for sending a command from said logical disk unit to said computer when said logical unit is in an operational position corresponding to said first virtual record on said logical track, means for applying said bytes to be written of said first virtual record from said computer via said channel to said logical disk unit, means for writing said applied bytes of said first virtual record into the location of said identified logical track where said bytes of said first virtual record are to be written, said writing being effected in an interleaved manner that said bytes of said first virtual record are written into a plurality of alternate and nonadjacent logical sectors of said assigned logical track of said logical disk unit, and means for writing applied bytes representing another virtual record of the other virtual track, of the same pair of virtual tracks that contains said first virtual record, into the logical sectors of said logical track that do not contain bytes of said first virtual record and that are intermediate and adjacent the logical sectors of said logical track that do contain bytes of said first virtual record, said writing being effected in said interleaved manner so that adjacent sectors of said logical track contain bytes of different virtual records from said pair of virtual tracks of a single virtual cylinder.

* * * * *